(12) United States Patent
Date

(10) Patent No.: US 12,354,677 B2
(45) Date of Patent: Jul. 8, 2025

(54) SEMICONDUCTOR STORAGE DEVICE

(71) Applicant: Kioxia Corporation, Tokyo (JP)

(72) Inventor: Hiroki Date, Chigasaki Kanagawa (JP)

(73) Assignee: Kioxia Corporation, Tokyo (JP)

( * ) Notice: Subject to any disclaimer, the term of this patent is extended or adjusted under 35 U.S.C. 154(b) by 169 days.

(21) Appl. No.: 18/337,589

(22) Filed: Jun. 20, 2023

(65) Prior Publication Data

US 2024/0096430 A1    Mar. 21, 2024

(30) Foreign Application Priority Data

Sep. 20, 2022 (JP) ................................ 2022-149513

(51) Int. Cl.
  *G11C 16/30* (2006.01)
  *G11C 16/08* (2006.01)
  *G11C 16/26* (2006.01)
  *G11C 16/34* (2006.01)

(52) U.S. Cl.
  CPC .......... *G11C 16/3436* (2013.01); *G11C 16/08* (2013.01); *G11C 16/26* (2013.01)

(58) Field of Classification Search
  CPC .......... G11C 16/30; G11C 16/28; G11C 16/04
  See application file for complete search history.

(56) References Cited

U.S. PATENT DOCUMENTS

| | | |
|---|---|---|
| 9,553,506 B1 | 1/2017 | Huyhn et al. |
| 9,653,126 B2 | 5/2017 | Nguyen et al. |
| 9,792,996 B1 | 10/2017 | Date |
| 10,418,118 B2 | 9/2019 | Date |
| 10,622,079 B2 | 4/2020 | Date |
| 10,685,689 B2 | 6/2020 | Date |
| 10,861,537 B1 | 12/2020 | Lien et al. |
| 11,335,388 B2 | 5/2022 | Date |
| 2012/0275226 A1* | 11/2012 | Nakamura ............ G11C 16/30 365/185.21 |
| 2022/0254393 A1 | 8/2022 | Date |
| 2022/0301627 A1 | 9/2022 | Date |

\* cited by examiner

*Primary Examiner* — Jason Lappas
(74) *Attorney, Agent, or Firm* — Holtz, Holtz & Volek PC

(57) ABSTRACT

In one embodiment, a semiconductor storage device includes memory cell transistors, and a word line electrically connected to the memory cell transistors. The device further includes a voltage generator configured to generate a first voltage transferred to the word line, the voltage generator including a voltage divider configured to divide the first voltage with first and second resistance elements, the first or second resistance element being a variable resistance element that receives a first digital signal indicating a resistance value and is changeable to the resistance value. The device further includes a control unit configured to output the first digital signal, wherein the control unit outputs the first digital signal such that a theoretical waveform of the first voltage in boosting the first voltage in an erasing verifying operation is different from a theoretical waveform of the first voltage in boosting the first voltage in a reading operation.

20 Claims, 15 Drawing Sheets

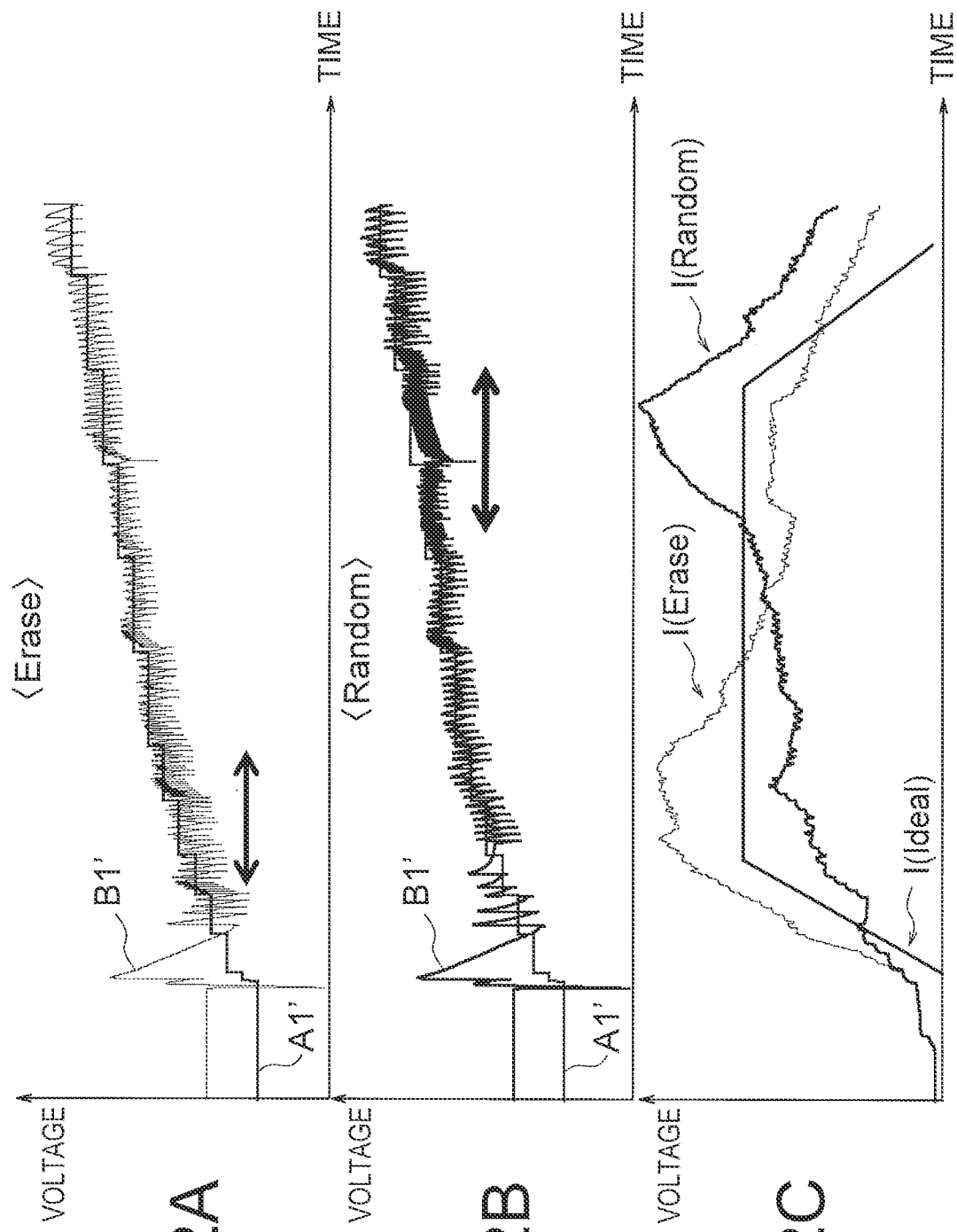

SEMICONDUCTOR STORAGE DEVICE

CROSS REFERENCE TO RELATED APPLICATION

This application is based upon and claims the benefit of priority from the prior Japanese Patent Application No. 2022-149513, filed on Sep. 20, 2022, the entire contents of which are incorporated herein by reference.

FIELD

Embodiments described herein relate to a semiconductor storage device.

BACKGROUND

When a word line in a semiconductor storage device is charged by a voltage generator, it is desirable to reduce a peak value of a current consumed by the voltage generator or to advance the completion of the charging.

BRIEF DESCRIPTION OF THE DRAWINGS

FIGS. 12A to 12C are timing charts for explaining exemplary operations of a memory system of the third embodiment.

DETAILED DESCRIPTION

Embodiments will now be explained with reference to the accompanying drawings. In FIGS. 1 to 15, the same configurations are given the same signs and their duplicated description is omitted.

In one embodiment, a semiconductor storage device includes a plurality of memory cell transistors, and a word line electrically connected in common to respective gates of the plurality of memory cell transistors. The device further includes a voltage generator configured to generate a first voltage transferred to the word line, the voltage generator including a charge pump circuit, a voltage divider configured to divide the first voltage with a first resistance element and a second resistance element, at least any of the first resistance element and the second resistance element being a variable resistance element that receives a first digital signal indicating a resistance value and is changeable to the resistance value, and a detector including a first input terminal connected to the voltage divider and a second input terminal different from the first input terminal, and configured to detect a monitor voltage supplied to the first input terminal based on a reference voltage supplied to the second input terminal, and control the charge pump circuit. The device further includes a control unit configured to output the first digital signal, wherein the control unit outputs the first digital signal such that a theoretical waveform of the first voltage in boosting the first voltage in an erasing verifying operation is different from a theoretical waveform of the first voltage in boosting the first voltage in a reading operation.

First Embodiment

Figure 1:
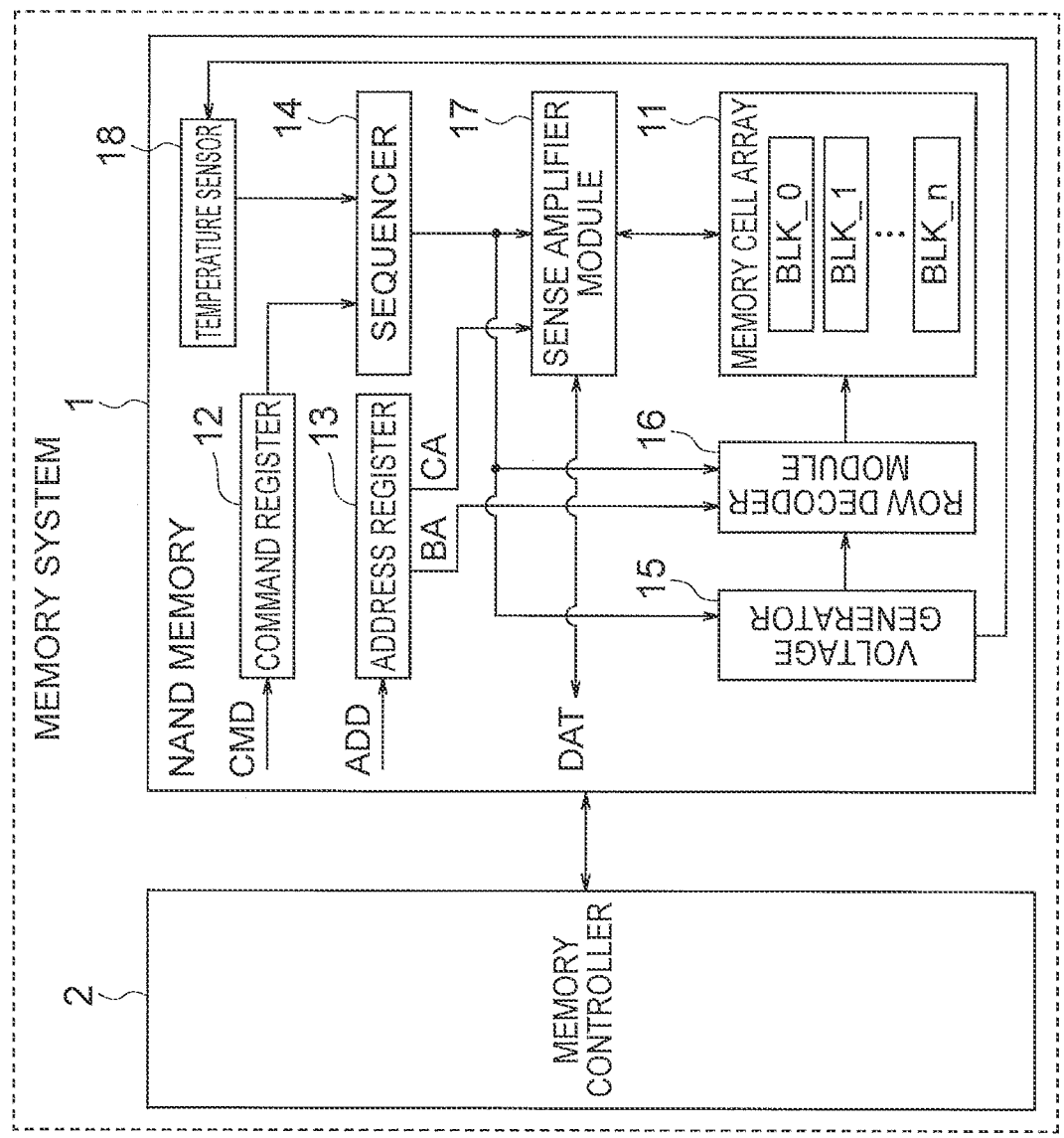
FIG. 1 is a block diagram showing a configuration of a memory system of a first embodiment.

FIG. 1 is a block diagram showing a configuration of a memory system of a first embodiment.

The memory system of the present embodiment includes a NAND memory 1 and a memory controller 2. The NAND memory 1 is an example of a semiconductor storage device, and the memory controller 2 is an example of a controller. The NAND memory 1 includes a memory cell array 11, a command register 12, an address register 13, a sequencer 14, a voltage generator 15, a row decoder module 16, a sense amplifier module 17, and a temperature sensor 18. The sequencer 14 is an example of a control unit.

Operations of the NAND memory 1 are controlled by the memory controller 2. The memory controller 2 operates in response to a request from a not-shown host device. For example, in response to a reading request from the host device, the memory controller 2 controls reading of data from the NAND memory 1. Moreover, in response to a writing request from the host device, the memory controller 2 controls writing of data to the NAND memory 1. Moreover, in response to an erasing request from the host device, the memory controller 2 controls erasing of data from the NAND memory 1.

The memory cell array 11 includes a plurality of blocks BLK. Each block BLK is a set of a plurality of memory cells which can store data in a non-volatile manner. The block BLK is used, for example, as a unit of erasing of data. Meanwhile, a page mentioned later is used, for example, as a unit of writing and a unit of reading of data. FIG. 1 shows, as an example of the blocks BLK, "n+1" blocks BLK_0 to BLK_n ("n" is an integer not less than 1). The memory cell array 11 further includes a plurality of bit lines and a plurality of word lines. Each memory cell is associated with one bit line and one word line.

The command register 12 holds a command "CMD" received from the memory controller 2 by the NAND memory 1. For example, the command "CMD" includes a command for causing the sequencer 14 to execute a reading operation, a writing operation, an erasing operation, or the like.

The address register 13 holds address information "ADD" received from the memory controller 2 by the NAND memory 1. For example, the address information "ADD" includes a block address "BA", a column address "CA", and the like. The block address "BA" and the column address "CA" are used when selecting the block BLK and the bit line, respectively.

The sequencer 14 controls operations of the whole NAND memory 1. For example, the sequencer 14 controls operations of the voltage generator 15, the row decoder module 16, and the sense amplifier module 17 based on the command "CMD" held in the command register 12. Thereby, based on the command "CMD", the reading operation, the writing operation, the erasing operation, or the like is executed.

The voltage generator 15 generates a voltage used by the reading operation, the writing operation, the erasing operation, or the like under the control by the sequencer 14. For example, the voltage generator applies (transfers) the generated voltage to a signal line corresponding to a selected word line. Moreover, the voltage generator 15 generates a power supply voltage for the temperature sensor 18 and applies the power supply voltage to the temperature sensor 18.

The row decoder module 16 selects the block BLK based on the block address BA held in the address register 13. The row decoder module 16 transfers the voltage applied to the signal line corresponding to the selected word line to the selected word line in the selected block BLK In the writing operation, the sense amplifier module 17 transfers writing data received from the memory controller 2 to the memory cell array 11. Moreover, in the reading operation, the sense amplifier module 17 determines a value stored in each memory cell based on a voltage of the bit line, and transfers the relevant result of the determination as reading data "DAT" to the memory controller 2.

The temperature sensor 18 detects a temperature of the NAND memory 1. The temperature sensor 18 generates temperature information based on the detected temperature, and transmits the temperature information to the sequencer 14. For example, the temperature information is used for the sequencer 14 correcting the voltage generated by the voltage generator 15, in the writing operation, the reading operation, the erasing operation, and the like.

Figure 2:
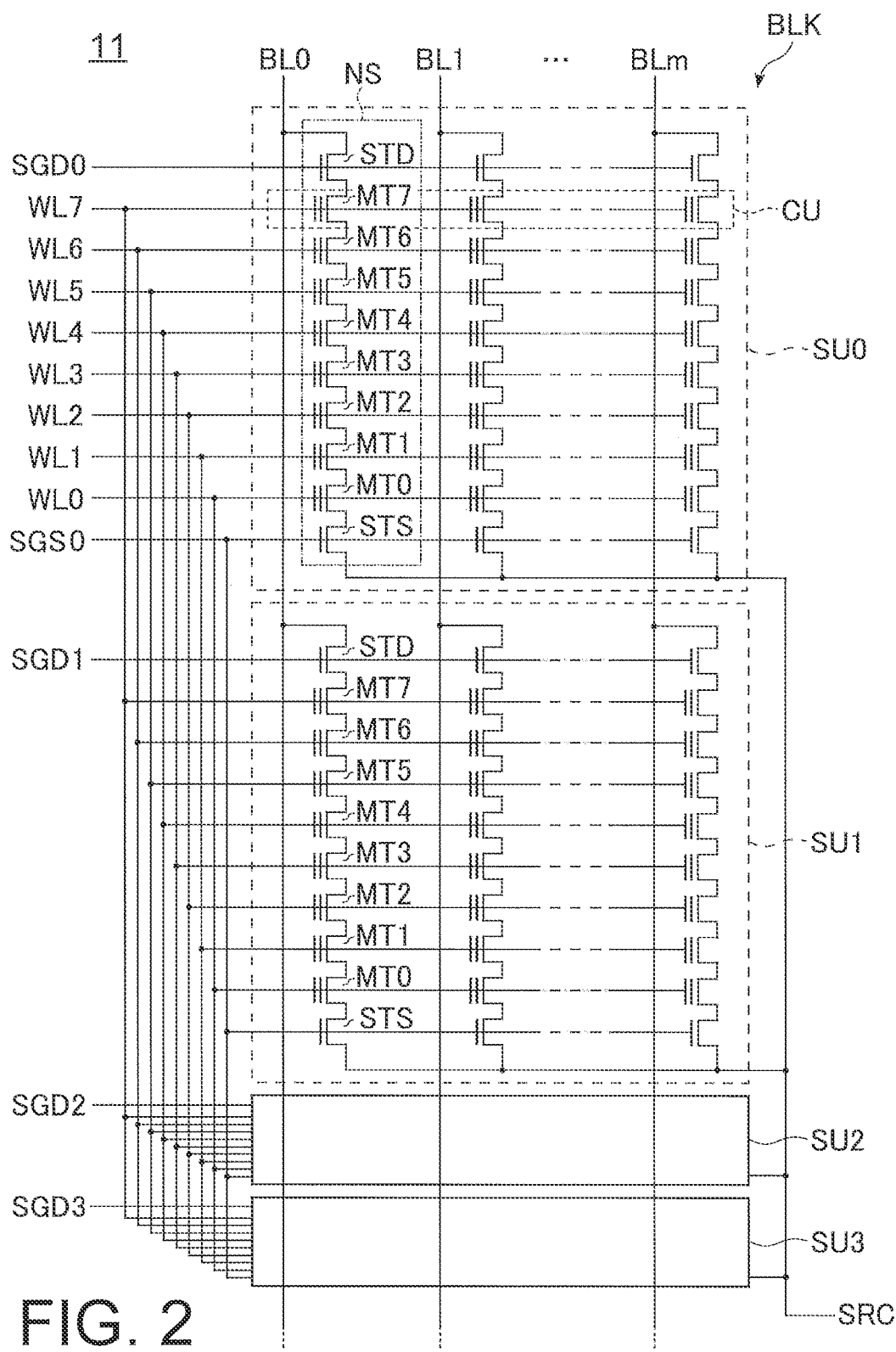
FIG. 2 is a circuit diagram showing a configuration of a memory cell array 11 of the first embodiment.

FIG. 2 is a circuit diagram showing a configuration of the memory cell array 11 of the first embodiment.

FIG. 2 shows one of the plurality of blocks BLK included in the memory cell array 11. As shown in FIG. 2, each block BLK of the present embodiment includes a plurality of string units SU0 to SU3. Each of the string units SU0 to SU3 includes "m+1" NAND strings NS ("m" is an integer not less than 1) between "m+1" bit lines BL0 to BLm and one source line SRC. Hereinafter, each of the string units SU0 to SU3 is also expressed as "string unit SU", and each of the bit lines BL0 to BLm are also expressed as "bit line BL".

In the string unit SU0, the NAND string NS between the bit line BL0 and the source line SRC includes memory cell transistors (memory cells) MT0 to MT7 on word lines WL0 to WL7. Furthermore, this NAND string NS includes a selection transistor STS on a source-side selection line SGS0 and includes a selection transistor STD on a drain-side selection line SGD0. In the present embodiment, the other NAND strings NS in the memory cell array 11 also have the similar structure. Hereinafter, each of the word lines WL0 to WL7 is also expressed as "word line WL", each of the memory cell transistors MT0 to MT7 is also expressed as "memory cell transistor MT", and each of the selection transistors STS and STD is also expressed as "selection transistor ST".

Each block BLK in the present embodiment includes a plurality of cell units CU. Each cell unit CU includes the plurality of memory cell transistors MT that are provided on one word line WL in one string unit SU. Therefore, each cell unit CU in FIG. 2 includes the "m+1" memory cell transistors MT. Each cell unit CU corresponds to one page. In each cell unit CU, each word line WL is electrically connected in common to respective gates of the "m+1" memory cell transistors MT.

Figure 3:
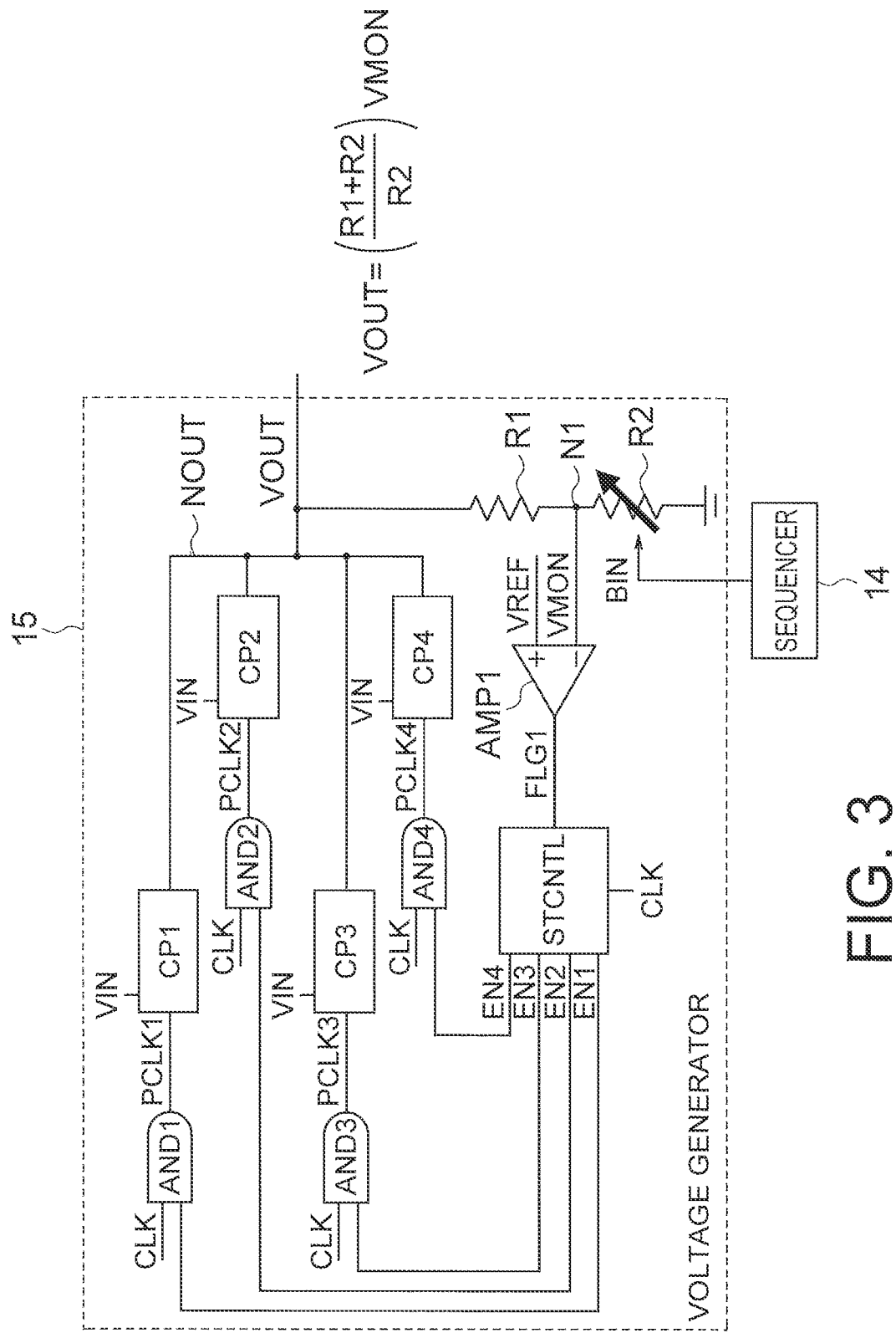
FIG. 3 is a circuit diagram showing a configuration of a voltage generator 15 of the first embodiment.

FIG. 3 is a circuit diagram showing a configuration of the voltage generator 15 of the first embodiment.

As shown in FIG. 3, the voltage generator 15 includes a plurality of charge pumps CP1 to CP4, a plurality of resistors R1 and R2, an operational amplifier AMP1, a state control circuit STCNTL, and a plurality of logic gates (AND gates) AND1 to AND4. FIG. 3 further shows a node NOUT and a node N1 in the voltage generator 15. A circuit including these charge pumps CP1 to CP4 is an example of a charge pump circuit. A circuit including these resistors R1 and R2 is an example of a voltage divider. The operational amplifier AMP1 is an example of a detector.

When a voltage "VIN" is input to the voltage generator 15, the voltage generator 15 generates a voltage "VOUT" higher than the voltage "VIN", and outputs the voltage "VOUT" from the node NOUT. For example, the voltage "VIN" is supplied from a voltage source in the NAND memory 1 to the voltage generator 15. For example, the voltage "VOUT" is used in the reading operation, the writing operation, the erasing operation, and the like. The voltage "VOUT" is an example of a first voltage. The voltage "VIN" is an example of a second voltage.

A signal BIN shown in FIG. 3 is output from the sequencer 14 and is input to the voltage generator 15. The signal BIN is a control signal for the sequencer 14 controlling operations of the voltage generator 15, and is a digital signal, for example. As mentioned later, a waveform of the voltage "VOUT" varies in accordance with information held by the signal BIN. Therefore, the sequencer 14 can change the waveform of the voltage "VOUT" by controlling the information held by the signal BIN. The signal BIN is an example of a first digital signal.

Next, details of the constituents in the voltage generator 15 are described subsequently with reference to FIG. 3.

The charge pump CP1 has an input terminal to which the voltage "VIN" is input, an input terminal to which a signal PCLK1 is input, and an output terminal electrically connectable to the node NOUT. The same applies to the charge pumps CP2 to CP4. Note that the charge pumps CP2 to CP4 have input terminals to which signals PCLK2 to PCLK4, in place of the signal PCLK1, are input. Hereinafter, each of the charge pumps CP1 to CP4 is also expressed as "charge pump CP", and each of the signals PCLK1 to PCLK4 is also expressed as "signal PCLK".

Each charge pump CP executes a boosting operation while the signal PCLK input to that charge pump CP is a clock signal CLK and the boosting operations of all the charge pumps CP are not being collectively prohibited by the sequencer 14. For example, when the voltage "VOUT" is higher than a threshold for collectively prohibiting the boosting operations, the boosting operations of all the charge pumps CP are collectively prohibited by the sequencer 14. When the signal PCLK that is input to a certain charge pump CP is the clock signal CLK and that charge pump CP is designated as a pump that can execute the boosting operation by the state control circuit STCNTL, the state of that charge pump CP is called "active". The active charge pump CP executes the boosting operation while the boosting operations of all the charge pumps CP are not being collectively prohibited by the sequencer 14.

Meanwhile, each charge pump CP stops the boosting operation while the signal PCLK input to that charge pump CP is not the clock signal CLK or the boosting operations of all the charge pumps CP are being collectively prohibited by the sequencer 14. When the signal PCLK that is input to a certain charge pump CP is not the clock signal CLK or that charge pump CP is designated as a pump that cannot execute the boosting operation by the state control circuit STCNTL, the state of that charge pump CP is called "inactive". The inactive charge pump CP stops the boosting operation even when the boosting operations of all the charge pumps CP are not collectively prohibited by the sequencer 14. An example of the case where the signal PCLK input to the charge pump CP is not the clock signal CLK is the case where the value of the signal PCLK is maintained to a L (low) level as mentioned later.

The resistor R1 is arranged between the node NOUT and the node N1. The resistor R2 is arranged between the node N1 and a ground node. Therefore, the resistor R1 and the resistor R2 are arranged in series between the node NOUT and the ground node. The resistor R2 of the present embodiment is a variable resistor. The value of the resistor R2 can be changed by the signal BIN. The relationship VOUT={(R1+R2)/R2}VMON is established between the voltages "VOUT" and "VMON". The voltage "MON" is called monitor voltage. As above, the resistors R1 and R2 divide the voltage "VOUT". One of the resistors R1 and R2 is an example of a first resistance element, and the other of the resistors R1 and R2 is an example of a second resistance element.

The operational amplifier AMP1 has a non-inverting input terminal to which a reference voltage "VREF" is input, an inverting input terminal to which the voltage "VMON" is input, and an output terminal that outputs a signal FLG1. The signal FLG1 is generated based on the comparison result of the reference voltage "VREF" and the voltage "VMON". For example, when the voltage "VMON" is less than the reference voltage "VREF", the value of the signal FLG1 becomes a H (high) level. On the other hand, when the voltage "VMON" is not less than the reference voltage "VREF", the value of the signal FLG1 becomes the L (low) level. The inverting input terminal to which the voltage "VMON" is input is an example of a first input terminal. The non-inverting input terminal to which the reference voltage "VREF" is input is an example of a second input terminal.

The state control circuit STCNTL has an input terminal to which the signal FLG1 is input from the operational amplifier AMP1, an input terminal to which the clock signal CLK is input, and output terminals that output signals EN1 to EN4 to logic gates AND1 to AND4. The state control circuit STCNTL calculates, using the clock signal CLK, a period "NH" during which the value of the signal FLG1 is maintained to the H level, and a period "NL" during which the value of the signal FLG1 is maintained to the L level. Furthermore, the state control circuit STCNTL generates the signals EN1 to EN4 based on the period "NH" and the period "NL". The signals EN1 to EN4 designate the charge pumps CP1 to CP4 to be active or to be inactive. Hereinafter, each of the signals EN1 to EN4 is also expressed as "signal EN".

When the value of the signal EN is the H level, the signal EN designates the charge pump CP to be active. On the other hand, when the value of the signal EN is the L level, the signal EN designates the charge pump CP to be inactive. Based on the period "NH" and the period "NL", the state control circuit STCNTL controls the number "Nu" of the signal(s) EN having the value of the H level out of the signals EN1 to EN4. The state of the state control circuit STCNTL moves between four states S1 to S4 in accordance with the number "Nu". The states S1 to S4 are states of the number "Nu" being one to four.

The logic gate AND1 has an input terminal to which the signal EN1 is input, an input terminal to which the clock signal CLK is input, and an output terminal that outputs the signal PCLK1 to the charge pump CP1. The signal PCLK1 indicates the AND operation result of the signal EN1 and the clock signal CLK. For example, when the value of the signal EN1 is the H level, the signal PCLK1 becomes the clock signal CLK. On the other hand, when the value of the signal EN1 is the L level, the value of the signal PCLK1 is maintained to the L level. The same applies to the logic gates AND2 to AND4. Note that the logic gates AND2 to AND4 have input terminals to which the signals EN2 to EN4, in place of the signal EN1, are input, and output terminals that output the signals PCLK2 to PCLK4, in place of the signal PCLK1. Hereinafter, each of the logic gates AND1 to AND4 is also expressed as "logic gate AND".

Figure 15:
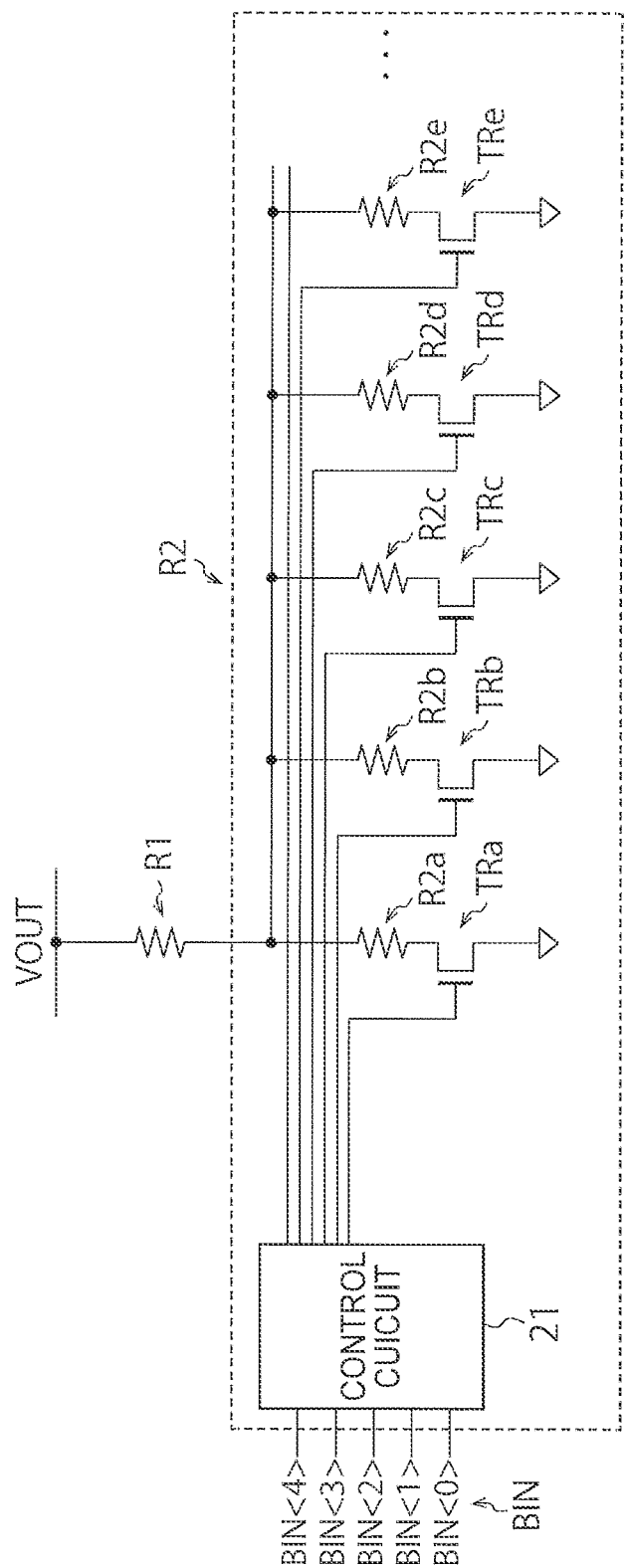
FIG. 15 is a circuit diagram showing a configuration of a resistor R2 of the first embodiment.

FIG. 15 is a circuit diagram showing a configuration of the resistor R2 of the first embodiment.

The aforementioned resistor R2 includes a control circuit 21, "N" resistors such as resistors R2a to R2e, and "N" transistors such as transistors TRa to TRe ("N" is an integer not less than 2). The resistor R2 functions as the variable resistor with these circuit elements.

The resistors R2a to R2e are connected in parallel to one another with respect to the resistor R1. The transistor TRa to TRe are connected in series to the resistors R2a to R2e. The control circuit 21 outputs control signals for controlling the transistors TRa to TRe, based on the signal BIN. The control signals for the transistors TRa to TRe are supplied to gates of the transistors TRa to TRe. The same above applies to resistors other than the resistor R2a to R2e and transistors other than the transistors TRa to TRe.

The control circuit 21 controls the "N" transistors to be turned on or off with the aforementioned control signals, based on the signal BIN. Consequently, the value of the resistor R2 is determined by the value(s) of the resistor(s) that is(are) connected in series to the turned-on transistor(s). This makes it possible to change the value of the resistor R2 with the signal BIN.

For example, the signal BIN is an "N-bit" digital signal, and the value of each bit, the "L level" or the "H level", corresponds to "being turned off" or "being turned on" of the corresponding transistor. For example, when the values of all the bits become the H level, all the "N" transistors are turned on. FIG. 15 exemplarily shows BIN <0> to BIN <4> included in the BIN signal. The transistors TRa to TRe are controlled to be turned on or off with BIN <0> to BIN <4>. The signal BIN of the present embodiment indicates a resistance value of the resistor R2, and the control circuit 21 of the present embodiment controls the aforementioned transistors to be turned on or off such that the resistance value of the resistor R2 becomes the resistance value indicated by the signal BIN.

Figures 4A, 4B:
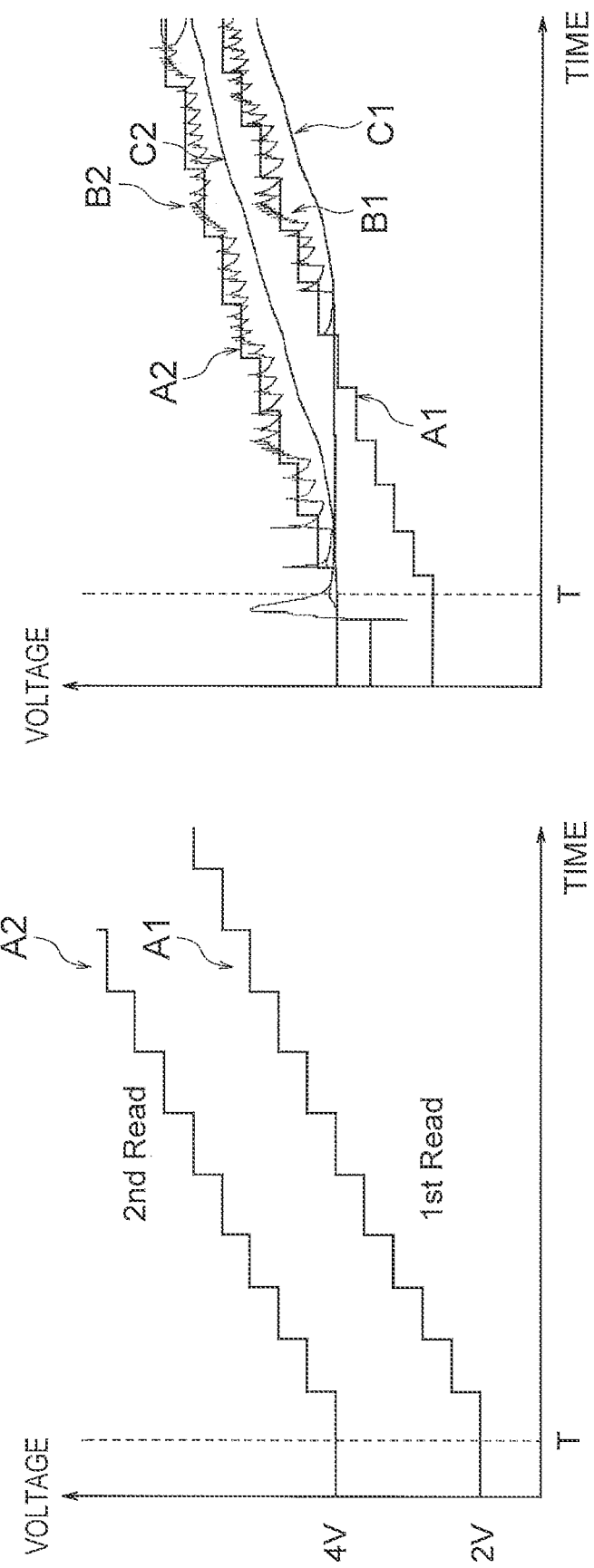
FIGS. 4A and 4B are timing charts for explaining exemplary operations of the memory system of the first embodiment.

FIGS. 4A and 4B are timing charts for explaining exemplary operations of the memory system of the first embodiment.

As mentioned above, the memory cell array 11 includes the plurality of memory cells, the plurality of word lines, the plurality of bit lines, and the like (FIG. 2). In the reading operation, data is read from selected cells of these memory cells. Each of the memory cells other than the selected cells is called unselected cell. In the reading operation, a low voltage is applied to the word lines that are electrically connected to the selected cells (selected word lines), and a high voltage is applied to the word lines that are electrically connected to the unselected cells (unselected word lines). This makes it possible to read data only from the selected cells out of the selected cells and the unselected cells.

In the reading operation, the sequencer 14 outputs the signal BIN, and the voltage generator 15 outputs the voltage "VOUT" which varies in accordance with the information held by the signal BIN. The voltage "VOUT" is supplied to the word lines. Thereby, the word lines are charged with the voltage "VOUT", and the voltages of the word lines rise. Consequently, the aforementioned low voltage is applied to the selected word lines, and the aforementioned high voltage is applied to the unselected word lines.

The signal BIN holds information for generating a voltage "VOUT'" mentioned later. Nevertheless, actually, the voltage "VOUT", not the voltage "VOUT'", results in being generated in accordance with the signal BIN under the influence of a delay and/or an error. Namely, although the signal BIN should theoretically generate the voltage "VOUT'", the signal BIN results in generating the voltage "VOUT" actually. The value of the voltage "VOUT'" corresponds to a theoretical value of the voltage "VOUT", and a waveform of the voltage "VOUT'" corresponds to a theoretical waveform of the voltage "VOUT". Hereinafter, the voltage "VOUT'" is expressed as "theoretical voltage "VOUT'"".

FIG. 4A shows temporal changes of the theoretical voltage "VOUT'" for an unselected word line in the reading operation. Sign A1 indicates a temporal change of the theoretical voltage "VOUT'" in 1st Read (first reading), and sign A2 indicates a temporal change of the theoretical voltage "VOUT'" in 2nd Read (second reading). Sign "T" indicates a charging starting time (boosting starting time) of the word line.

There is supposed as an example a case where data is read from the memory cell array 11, and after that, data is reread from the memory cell array 11. In this case, when a period between the former reading and the latter reading is short, the voltage of the word line has not been returned to zero in the latter reading. Reading that is started before the voltage of the word line is returned to zero is called 2nd Read. Meanwhile, reading that is started in the state where the voltage of the word line is zero is called 1st Read.

In the reading operation, the sequencer 14 of the present embodiment controls the signal BIN for unselected word lines such that the theoretical voltage "VOUT'" for an unselected word line in 2nd Read being performed changes in a different manner from that of the theoretical voltage "VOUT'" for the unselected word line in 1st Read being performed. Therefore, in FIG. 4A, the theoretical voltage "VOUT'" indicated by sign A2 changes in a different manner from that of the theoretical voltage "VOUT'" indicated by sign A1.

Specifically, the waveform indicated by sign A2 has a shape having the waveform indicated by sign A1 translated parallel in the longitudinal direction. Therefore, rising timing, a rising cycle, and a rising rate of the theoretical voltage "VOUT'" indicated by sign A2 are the same as rising timing, a rising cycle, and a rising rate of the theoretical voltage "VOUT'" indicated by sign A1 at any time point. Both of the theoretical voltage "VOUT'" indicated by sign A1 and the theoretical voltage "VOUT'" indicated by sign A2 rise stepwise. Meanwhile, the value of the theoretical voltage "VOUT'" indicated by sign A2 at the start of charging is higher than the value of the theoretical voltage "VOUT'" indicated by sign A1 at the start of charging. In FIG. 4A, the theoretical voltage "VOUT'" rises stepwise. Hence, the rising cycle of the theoretical voltage "VOUT'" is a time width for one step of the theoretical voltage "VOUT'". In addition, the rising rate of the theoretical voltage "VOUT'" is a value obtained by dividing a voltage rising width for the one step of the theoretical voltage "VOUT'" by the time width for the one step of the theoretical voltage "VOUT'".

In FIG. 4A, the waveform indicated by sign A2 has a shape having the waveform indicated by sign A1 translated parallel in the longitudinal direction, the shape having the waveform indicated by sign A1 not modified at all. Nevertheless, the waveform indicated by sign A2 may have a shape having the waveform indicated by sign A1 modified, the shape having the waveform indicated by sign A1 translated parallel in the longitudinal direction. Such an example of the waveform is shown in FIG. 4B mentioned later.

FIG. 4B shows, in addition to the waveforms indicated by signs A1 and A2, waveforms indicated by signs B1, B2, C1, and C2. Both of signs B1 and B2 indicate temporal changes of the voltage "VOUT" in 2nd Read. Both of signs C1 and C2 indicate temporal changes of the voltage of the word line that is distant from the node NOUT in 2nd Read. Note that signs B1 and C1 indicate the voltages in the case of employing the theoretical voltage "VOUT'" for 1st Read indicated by sign A1 and that signs B2 and C2 indicate the voltages in the case of employing the theoretical voltage "VOUT'" for 2nd Read indicated by sign A2.

The waveform of the voltage "VOUT" changes so as to follow the waveform of the theoretical voltage "VOUT'". Therefore, in FIG. 4B, the voltage "VOUT" indicated by sign B1 rises so as to follow the theoretical voltage "VOUT'" indicated by sign A1, and has a waveform in such a manner as to oscillate near the waveform of the theoretical voltage "VOUT'" indicated by sign A1. Likewise, the voltage "VOUT" indicated by sign B2 rises so as to follow the theoretical voltage "VOUT'" indicated by sign A2, and has a waveform in such a manner as to oscillate near the waveform of the theoretical voltage "VOUT'" indicated by sign A2.

Note that the voltage "VOUT" indicated by sign B1 and the word line voltage indicated by sign C1 do not rise while these voltages are higher than the theoretical voltage "VOUT'" indicated by sign A1. This phenomenon occurs because the voltage of the word line has not been returned to zero at the start of charging for 2nd Read. Consequently, the completion of charging of the word line becomes late.

On the other hand, the voltage "VOUT" indicated by sign B2 and the word line voltage indicated by sign C2 rise from the start of charging for 2nd Read. The reason is that at the start of charging for 2nd Read, not only the voltage of the word line but also the theoretical voltage "VOUT'" indicated by sign A2 are sufficiently high. This makes it possible to advance the completion of charging of the word line.

Figure 5A:
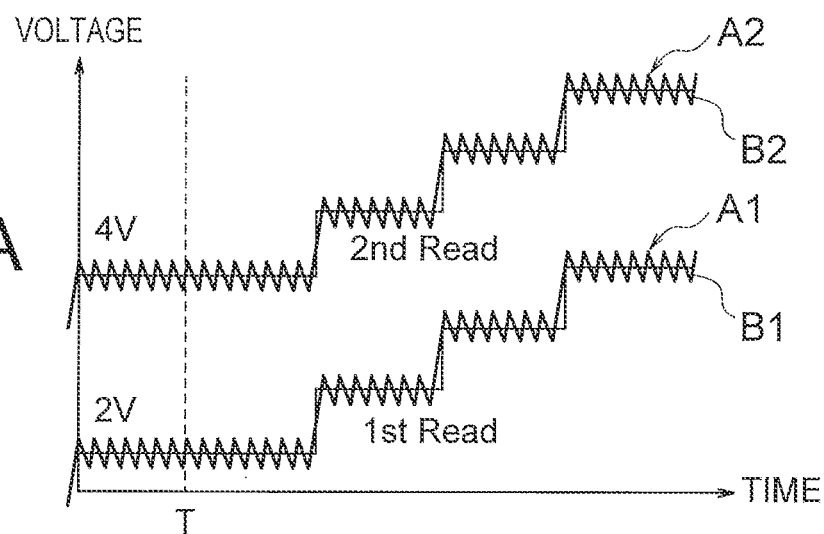
FIGS. 5A to 5C are timing charts for further explaining the exemplary operations of the memory system of the first embodiment.
Figure 5B:
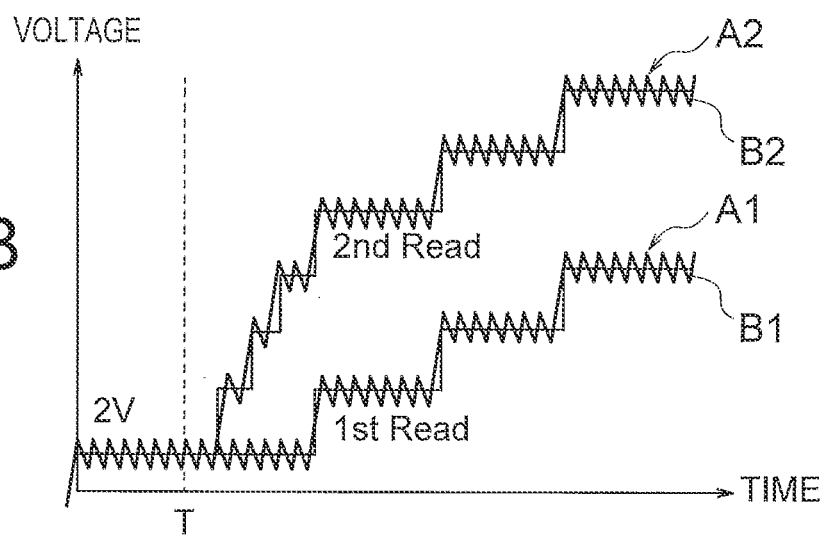
Figure 5C:
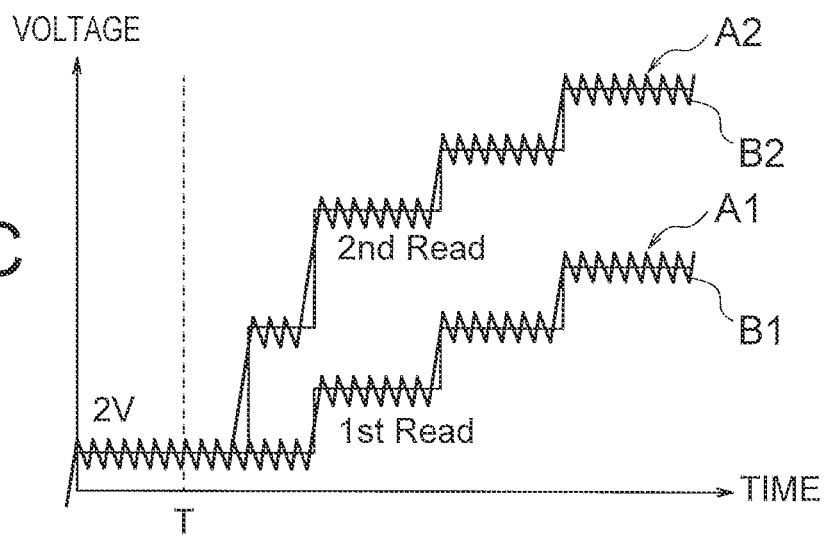

FIGS. 5A to 5C are timing charts for further explaining the exemplary operation of the memory system of the first embodiment.

FIG. 5A, FIG. 5B, and FIG. 5C show temporal changes of the theoretical voltage "VOUT'" in the reading operations. While the example shown in FIG. 5A is the same as the example shown in FIG. 4A, it is shown for comparison with the examples shown in FIG. 5B and FIG. 5C. FIG. 5A, FIG.

5B, and FIG. 5C further show temporal changes of the voltage "VOUT" for an unselected word line in the reading operations.

In FIG. 5B, the rising rate of the theoretical voltage "VOUT'" indicated by sign A2 is higher than the rising rate of the theoretical voltage "VOUT'" indicated by sign A1 in a predetermined time from the start of charging. Specifically, when the theoretical voltage "VOUT'" indicated by sign A1 rises for the first time, the theoretical voltage "VOUT'" indicated by sign A2 has risen for the fourth time. Moreover, during the period from the start of charging to this time point, a voltage rising value at one time rising of the theoretical voltage "VOUT'" indicated by sign A2 is the same as a voltage rising value at one time rising of the theoretical voltage "VOUT'" indicated by sign A1. Therefore, during the period from the start of charging to this time point, the rising rate of the theoretical voltage "VOUT'" indicated by sign A2 is four times the rising rate of the theoretical voltage "VOUT'" indicated by sign A1. The rising cycle of the theoretical voltage "VOUT'" indicated by sign A2 is one fourth the rising cycle of the theoretical voltage "VOUT'" indicated by sign A1. This makes it possible to advance the completion of charging of the word line in 2nd Read. The values of "four times" and "one fourth" above are merely exemplary and these may take other values.

In FIG. 5B, the changes of the theoretical voltage "VOUT'" indicated by signs A1 and A2 are reflected on the changes of the voltage "VOUT" indicated by signs B1 and B2, respectively. Therefore, the rising rate, the number of times of rising, and the voltage rising value for the theoretical voltage "VOUT'" correspond to the rising rate, the number of times of rising, and the voltage rising value for an average value of the voltage "VOUT", respectively. Moreover, the rising cycle of the theoretical voltage "VOUT'" corresponds to a period during which the average value of the voltage "VOUT" is kept constant. The reason is that the average value of the voltage "VOUT" approximately coincides with the value of the theoretical voltage "VOUT'". Herein, the average value of the voltage "VOUT" is an average of values of the voltage "VOUT" during one time oscillation of the voltage "VOUT", for example, being the average of the maximum value and the minimum value of the voltage "VOUT" during one time oscillation of the voltage "VOUT". In FIG. 5B, during the period from the start of charging to the aforementioned time point, the rising rate of the average value of the voltage "VOUT" indicated by sign B2 is four times the rising rate of the average value of the voltage "VOUT" indicated by sign B1. In addition, the period during which the average value of the voltage "VOUT" indicated by sign B2 is kept constant is one fourth the period during which the average value of the voltage "VOUT" indicated by sign B1 is kept constant.

It also applies to FIG. 5A mentioned above and FIG. 5C mentioned below that the changes of the theoretical voltage "VOUT'" indicated by signs A1 and A2 are reflected on the changes of the voltage "VOUT" indicated by signs B1 and B2, respectively. The same still also applies to second and third embodiments. For example, the theoretical voltage "VOUT'" at the start of charging corresponds to the average value of the voltage "VOUT" at the start of charging. At the start of charging in FIG. 5A, the average value of the voltage "VOUT" indicated by sign B2 is higher than the average value of the voltage "VOUT" indicated by sign B1.

Also in FIG. 5C, in a predetermined time from the start of charging, the rising rate of the theoretical voltage "VOUT'" indicated by sign A2 is higher than the rising rate of the theoretical voltage "VOUT'" indicated by sign A1. Specifically, when the theoretical voltage "VOUT'" indicated by sign A1 rises for the first time, the theoretical voltage "VOUT'" indicated by sign A2 has risen for the second time. Moreover, during the period from the start of charging to this time point, the voltage rising value at one time rising of the theoretical voltage "VOUT'" indicated by sign A2 is twice the voltage rising value at one time rising of the theoretical voltage "VOUT'" indicated by sign A1. Therefore, during the period from the start of charging to this time point, the rising rate of the theoretical voltage "VOUT'" indicated by sign A2 is four times the rising rate of the theoretical voltage "VOUT'" indicated by sign A1. In addition, the rising cycle of the theoretical voltage "VOUT'" indicated by sign A2 is one half the rising cycle of the theoretical voltage "VOUT'" indicated by sign A1. This makes it possible to advance the completion of charging of the word line in 2nd Read. The values of "four times" and "one half" are merely exemplary and these may take other values.

The rising cycle of the theoretical voltage "VOUT'" is a time from the time point when the theoretical voltage "VOUT'" rises to the time point when the theoretical voltage "VOUT'" next rises. Moreover, the rising rate of the theoretical voltage "VOUT'" is a rising value of the theoretical voltage "VOUT'" in a unit time.

FIGS. 6A to 6D are timing charts for further explaining the exemplary operations of the memory system of the first embodiment.

Figure 6C:
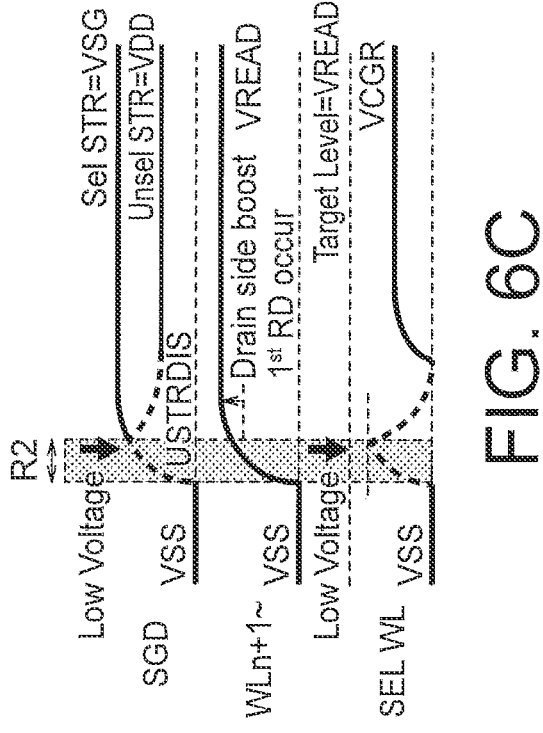
FIGS. 6A to 6D are timing charts for further explaining the exemplary operations of the memory system of the first embodiment.
Figure 6D:
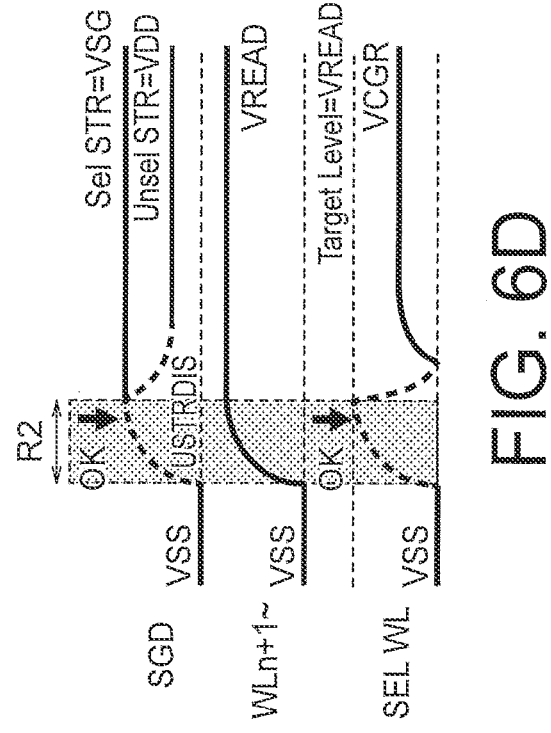
Figure 6A:
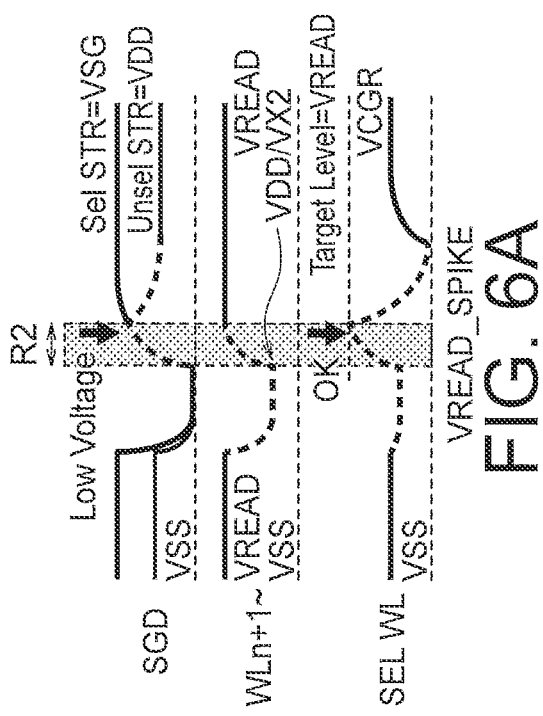
Figure 6B:
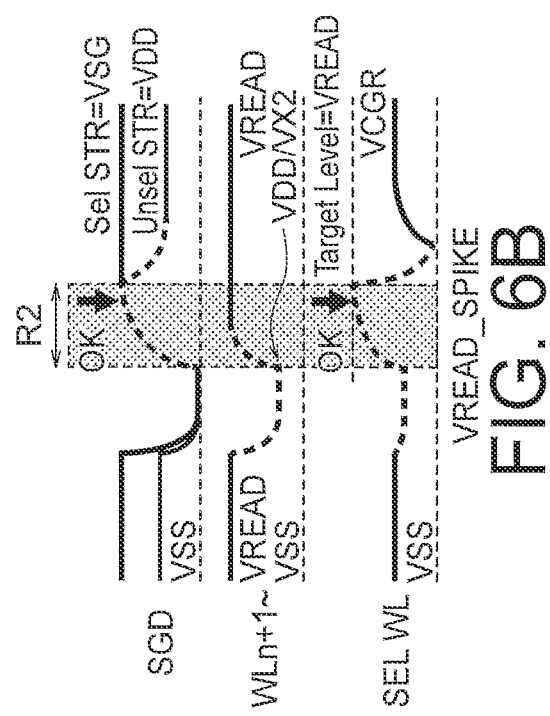

FIG. 6A and FIG. 6C show voltage changes in 2nd Read and in 1st Read, respectively, in the case where a time "R2" is short. FIG. 6B and FIG. 6D show voltage changes in 2nd Read and in 1st Read, respectively, in the case where the time "R2" is long. The time "R2" indicates a time required for charging the word line. Each of FIG. 6A to FIG. 6D shows temporal changes of voltages of the drain-side selection line (SGD), an unselected word line (WLn+1~), and a selected word line (SEL WL).

When the time "R2" is short, as shown in FIG. 6C, this results in occurrence, in 1st Read, of Read Disturb due to drain-side boosting. This problem can be restrained by elongating the time "R2" as shown in FIG. 6D. Nevertheless, elongating the time "R2" results in delaying the completion of charging of the word line in 2nd Read as shown in FIG. 6B. The present embodiment makes it possible to solve such a problem of the completion of charging being delayed, as mentioned above.

As above, the sequencer 14 of the present embodiment controls the signal BIN for unselected word lines such that in the reading operation, the theoretical voltage "VOUT'" for an unselected word line in 2nd Read being performed changes in a different manner from that of the theoretical voltage "VOUT'" for the unselected word line in 1st Read being performed. Thereby, the voltage "VOUT" for the unselected word line in 2nd Read being performed also changes in a different manner from that of the voltage "VOUT" for the unselected word line in 1st Read being performed. Therefore, the present embodiment makes it possible to advance the completion of charging of the word line.

Hereafter, a memory system of the second embodiment and a memory system of the third embodiment are described. Configurations and operations of the memory systems of the second and third embodiments are almost similar to the configurations and the operations of the memory system of the first embodiment. In the description below, differences between the memory system of the first embodiment and the memory systems of the second and third embodiments are mainly described.

Second Embodiment

Figure 7:
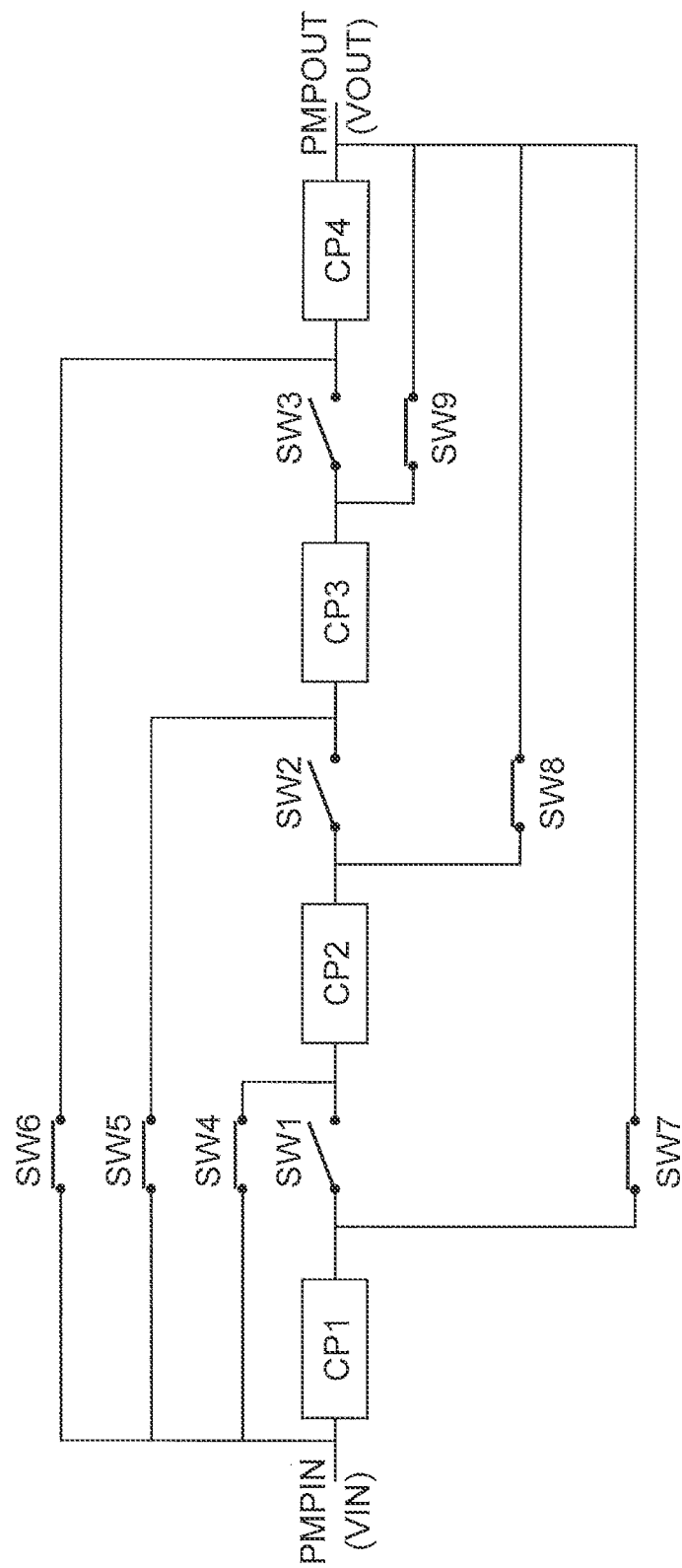
FIG. 7 is a circuit diagram showing a configuration of a voltage generator 15 of a second embodiment.

FIG. 7 is a circuit diagram showing a configuration of a voltage generator 15 of the second embodiment.

As with the NAND memory 1 of the first embodiment, a NAND memory 1 of the present embodiment includes the voltage generator 15. Note that charge pumps CP1 to CP4 in a voltage generator 15 of the present embodiment have a configuration shown in FIG. 7.

FIG. 7 shows an input terminal PMPIN of the voltage generator 15 and an output terminal PMPOUT of the voltage generator 15. In FIG. 7, the voltage "VIN" is input to the input terminal PMPIN, and the voltage "VOUT" is output from the output terminal PMPOUT. The input terminal PMPIN is electrically connected to an input terminal of the charge pump CP1. The output terminal PMPOUT is electrically connected to an output terminal of the charge pump CP4. FIG. 7 further shows switches SW1 to SW9 in the voltage generator 15.

The switch SW1 is arranged between an output terminal of the charge pump CP1 and an input terminal of the charge pump CP2. The switch SW2 is arranged between an output terminal of the charge pump CP2 and an input terminal of the charge pump CP3. The switch SW3 is arranged between an output terminal of the charge pump CP3 and an input terminal of the charge pump CP4.

The switch SW4 is electrically connected to the input terminal PMPIN, and is electrically connected to a node between the switch SW1 and the input terminal of the charge pump CP2. The switch SW5 is electrically connected to the input terminal PMPIN, and is electrically connected to a node between the switch SW2 and the input terminal of the charge pump CP3. The switch SW6 is electrically connected to the input terminal PMPIN, and is electrically connected to a node between the switch SW3 and the input terminal of the charge pump CP4.

The switch SW7 is electrically connected to the output terminal PMPOUT, and is electrically connected to a node between the output terminal of the charge pump CP1 and the switch SW1. The switch SW8 is electrically connected to the output terminal PMPOUT, and is electrically connected to a node between the output terminal of the charge pump CP2 and the switch SW2. The switch SW9 is electrically connected to the output terminal PMPOUT, and is electrically connected to a node between the output terminal of the charge pump CP3 and the switch SW3.

A sequencer 14 of the present embodiment can switch the state of the voltage generator 15 by switching the switches SW1 to SW9 between being turned on and off. In FIG. 7, the switches SW1 to SW3 are opened (turned off), and the switches SW4 to SW9 are closed (turned on). Consequently, the charge pumps CP1 to CP4 are connected electrically in parallel to one another as with the configuration shown in FIG. 3. Hereafter, the connection state shown in FIG. 7 is called four-parallel state.

Figure 8:
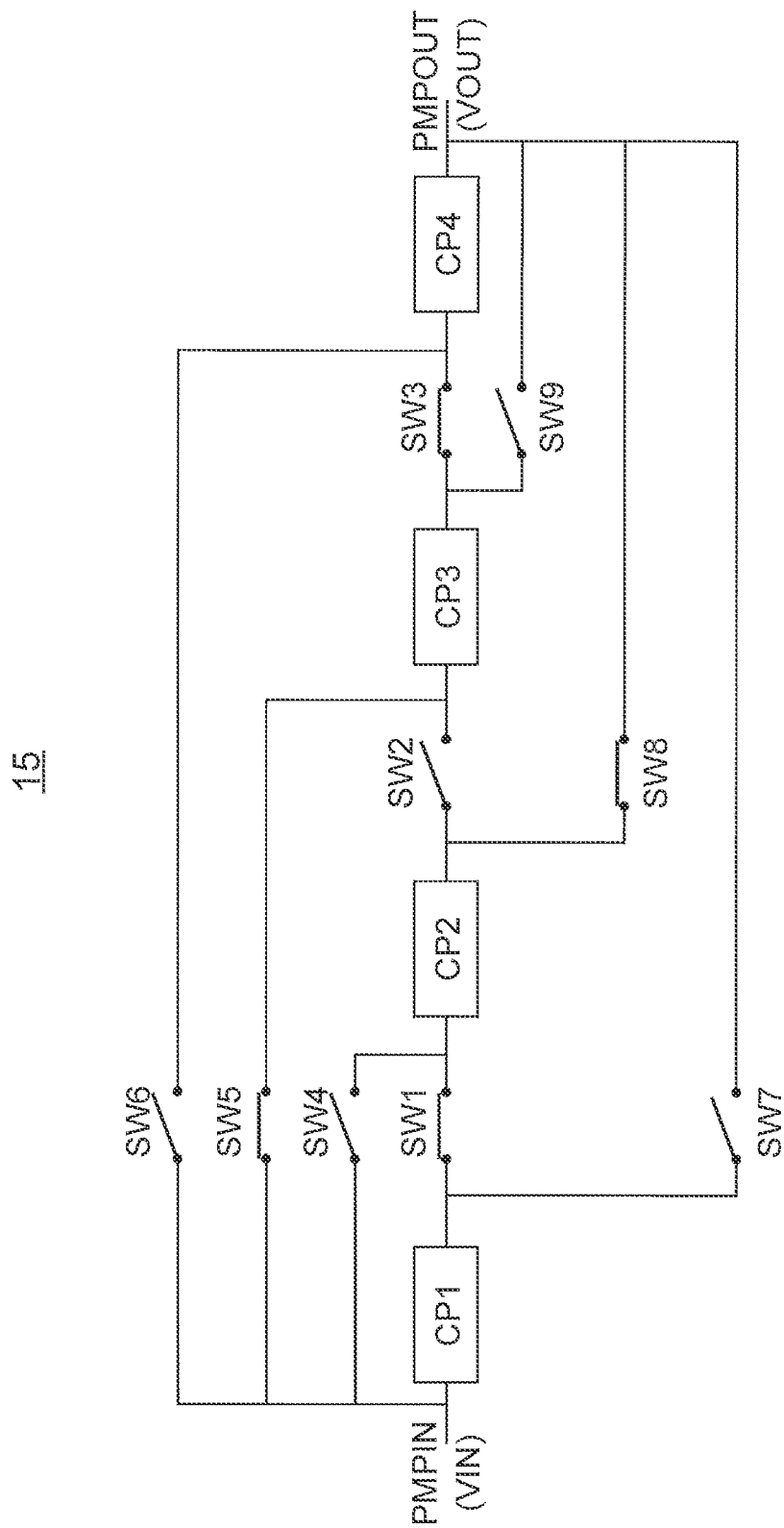
FIG. 8 is another circuit diagram showing a configuration of the voltage generator 15 of the second embodiment.
Figure 9:
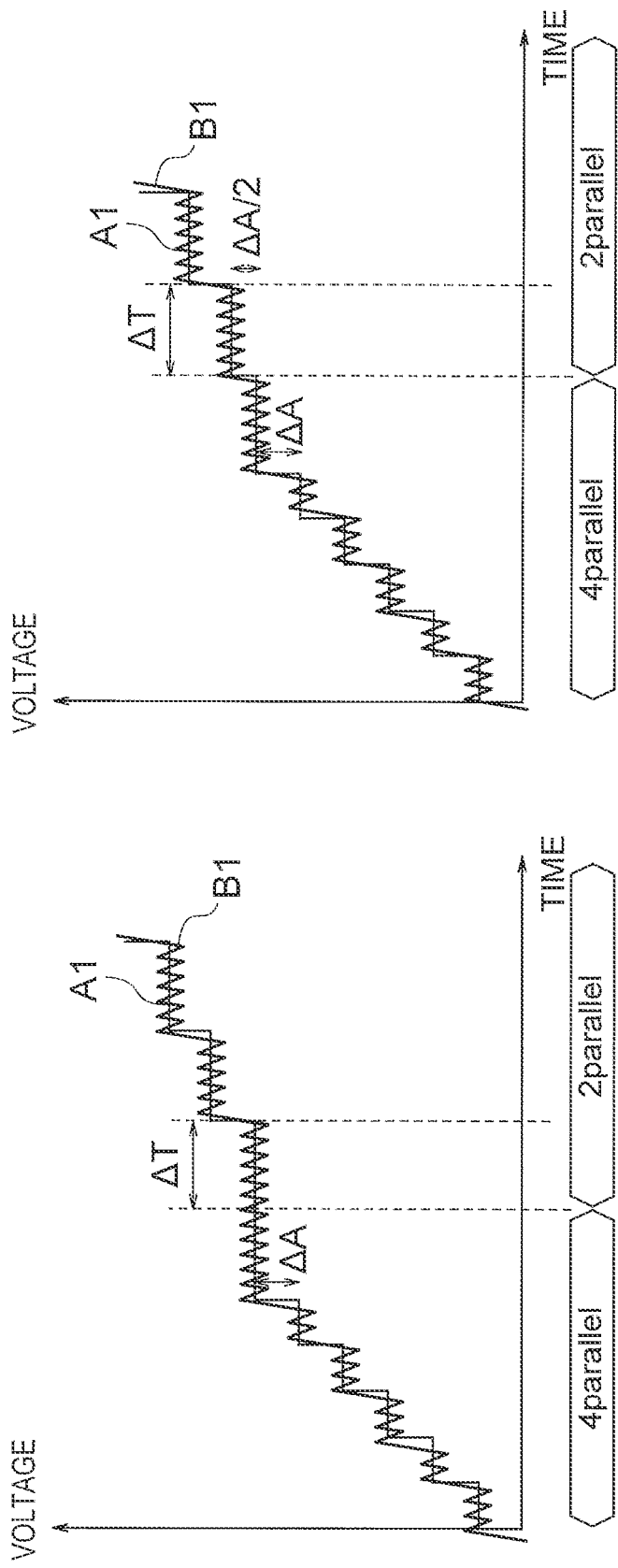
FIGS. 9A and 9B are timing charts for explaining exemplary operations of a memory system of the second embodiment.

FIG. 8 is another circuit diagram showing a configuration of the voltage generator 15 of the second embodiment.

The voltage generator 15 shown in FIG. 8 is the same as the voltage generator 15 shown in FIG. 7, but is in a different state from that of the voltage generator 15 shown in FIG. 7. In FIG. 8, the switches SW1, SW3, SW5, and SW8 are closed (turned on), and the switches SW2, SW4, SW6, SW7, and SW9 are opened (turned off). Consequently, the charge pumps CP1 and CP2 are connected electrically in series to each other, and the charge pumps CP3 and CP4 are connected electrically in series to each other. Furthermore, the pair of the charge pumps CP1 and CP2 and the pair of the charge pumps CP3 and CP4 are connected electrically in parallel to each other. Hereafter, the connection state shown in FIG. 8 is called two-parallel state.

For example, the sequencer 14 of the present embodiment can switch the state of the voltage generator 15, interlocking with an operation of a timer, from one of the four-parallel state and the two-parallel state to the other of the four-parallel state and the two-parallel state. The state of the voltage generator 15 may be switched by a constituent component other than the sequencer 14.

FIGS. 9A and 9B are timing charts for explaining exemplary operations of the memory system of the second embodiment.

FIG. 9A shows an example of the theoretical voltage "VOUT'" for an unselected word line in the reading operation. Sign A1 in FIG. 9A indicates an example of a temporal change of the theoretical voltage "VOUT'" in 1st Read, specifically indicating a temporal change of the theoretical voltage "VOUT'" on the occasion when the state of the voltage generator 15 switches from the four-parallel state to the two-parallel state. FIG. 9A further shows a temporal change of the voltage "VOUT" for the unselected word line in the reading operation.

In the reading operation, the sequencer 14 of the present embodiment controls the signal BIN for unselected word lines such that the theoretical voltage "VOUT'" for the unselected word line after the state of the voltage generator 15 switches changes in a different manner from that of the theoretical voltage "VOUT'" for the unselected word line before the state of the voltage generator 15 switches. Therefore, in FIG. 9A, the rising cycle of the theoretical voltage "VOUT'" for the unselected word line in the two-parallel state is longer than the rising cycle of the theoretical voltage "VOUT'" for the unselected word line in the four-parallel state. Furthermore, the rising cycle of the theoretical voltage "VOUT'" for the unselected word line at the time point when the state of the voltage generator 15 switches from the four-parallel state to the two-parallel state is longer than the rising cycles of the theoretical voltage "VOUT'" for the unselected word line before the switching and after the switching.

Specifically, in FIG. 9A, the rising cycle of the theoretical voltage "VOUT'" for the unselected word line in the four-parallel state is "$\Delta T/2$", and the rising cycle of the theoretical voltage "VOUT'" for the unselected word line in the two-parallel state is "$\Delta T$". Therefore, the rising cycle of the theoretical voltage "VOUT'" for the unselected word line in the two-parallel state is twice the rising cycle of the theoretical voltage "VOUT'" for the unselected word line in the four-parallel state. Furthermore, the rising cycle of the theoretical voltage "VOUT'" for the unselected word line at the time point when the state of the voltage generator 15 switches from the four-parallel state to the two-parallel state is "$2\Delta T$". Therefore, the rising cycle ($2\Delta T$) of the theoretical voltage "VOUT'" for the unselected word line at this time point is longer than the rising cycles ($\Delta T/2$ and $\Delta T$) of the theoretical voltage "VOUT'" for the unselected word line before the switching and after the switching. Moreover, in FIG. 9A, the voltage rising value at one time rising of the theoretical voltage "VOUT'" for the unselected word line is "$\Delta A$" as a constant value.

In FIG. 9A, a period indicated by the two broken lines sandwiching sign "$\Delta T$" is a period during which the theoretical voltage "VOUT'" for the unselected word line is not raised. When the state of the voltage generator 15 switches from the four-parallel state to the two-parallel state, the sequencer 14 of the present embodiment does not raise the theoretical voltage "VOUT'" for the unselected word line during the aforementioned period. Consequently, the rising cycle of the theoretical voltage "VOUT'" at the time point when the state of the voltage generator switches is "2ΔT".

FIG. 9B shows another example of the theoretical voltage "VOUT'" for the unselected word line in the reading operation. Sign A1 in FIG. 9B indicates an example of a temporal change of the theoretical voltage "VOUT'" in 1st Read, specifically indicating a temporal change of the theoretical voltage "VOUT'" on the occasion when the state of the voltage generator 15 switches from the four-parallel state to the two-parallel state. FIG. 9B further shows a temporal change of the voltage "VOUT" for the unselected word line in the reading operation.

The waveforms shown in FIG. 9B are approximately similar to the waveforms shown in FIG. 9A. Note that in FIG. 9B, the voltage rising value of the theoretical voltage "VOUT'" for the unselected word line at the time point when the state of the voltage generator 15 switches is "ΔA/2". Therefore, the rising rate ((ΔA/2)/ΔT) of the theoretical voltage "VOUT'" for the unselected word line at the time point when the state of the voltage generator 15 switches is lower than the rising rates (ΔA/(ΔT/2) and ΔA/ΔT) of the theoretical voltage "VOUT'" for the unselected word line before the switching and after the switching.

In FIG. 9B, a period indicated by the two broken lines sandwiching sign "ΔT" is a period during which the voltage rising value of the theoretical voltage "VOUT'" for the unselected word line is decreased. When the state of the voltage generator 15 switches from the four-parallel state to the two-parallel state, the sequencer 14 of the present embodiment decreases the voltage rising value of the theoretical voltage "VOUT'" for the unselected word line from "ΔA" to "ΔA/2" during the aforementioned period. Consequently, the rising rate of the theoretical voltage "VOUT'" at the time point when the state of the voltage generator switches is (ΔA/2)/ΔT.

While in FIG. 9B, the time point when the state of the voltage generator 15 switches coincides with the time point when the theoretical voltage "VOUT'" rises, it may be displaced from the time point when the theoretical voltage "VOUT'" rises. When the time point when the state of the voltage generator 15 switches is displaced from the time point when the theoretical voltage "VOUT'" rises, the rising rate of the theoretical voltage "VOUT'" immediately after the state of the voltage generator 15 switches, not at the time point when the state of the voltage generator 15 switches, is (ΔA/2)/ΔT. The same is also true for the rising cycle of the theoretical voltage "VOUT'" in FIG. 9A.

The present embodiment makes it possible to reduce the peak value of current consumed by the voltage generator 15 by changing the theoretical voltage "VOUT'" as shown in FIG. 9A or FIG. 9B. Details of such an effect are mentioned later.

Figure 10:
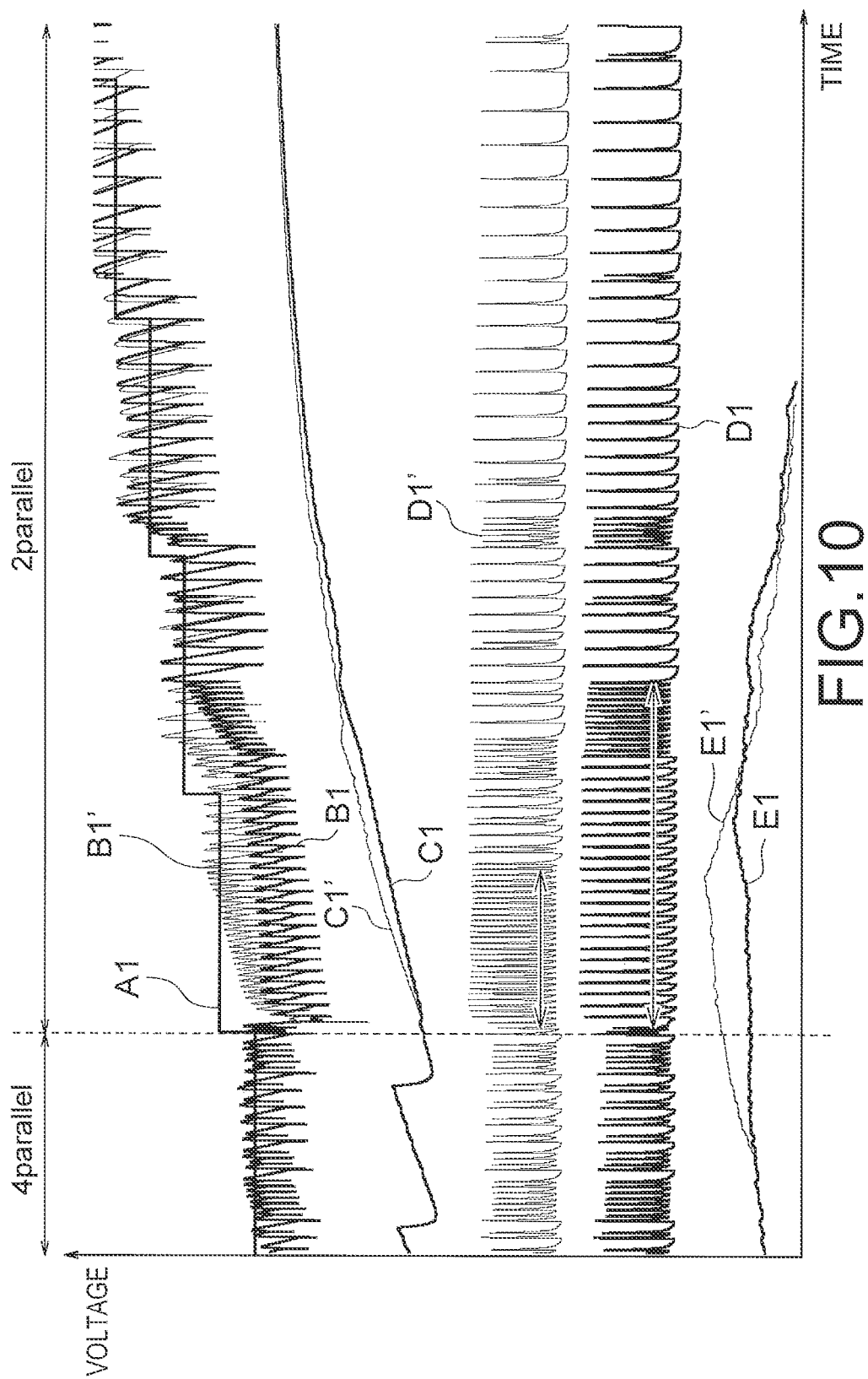
FIG. 10 is a timing chart for further explaining the exemplary operations of the memory system of the second embodiment.

FIG. 10 is a timing chart for further explaining the exemplary operations of the memory system of the second embodiment.

FIG. 10 shows waveforms indicated by signs A1, B1, C1, D1, and E1 regarding an operation in 1st Read of the present embodiment. FIG. 10 further shows waveforms indicated by signs B1', C1', D1', and E1' corresponding to the waveforms indicated by signs B1, C1, D1, and E1, regarding an operation in 1st Read of a comparative example of the present embodiment. The waveform A1 in FIG. 10 indicates the theoretical voltage "VOUT'" before fluctuation of the theoretical voltage "VOUT'" in the period indicated by sign "ΔT" is eliminated as in the waveform A1 of FIG. 9A or fluctuation of the theoretical voltage "VOUT'" in the period indicated by sign "ΔT" is reduced as in the waveform A1 of FIG. 9B.

In FIG. 10, sign A1 indicates the theoretical voltage "VOUT'" for an unselected word line. Sign B1 indicates the voltage "VOUT" for the unselected word line. Sign C1 indicates the voltage of an unselected word line that is distant from the node NOUT. Sign D1 indicates a current "Icc" that arises in charging of the unselected word line. Sign E1 indicates a time average of the current "Icc". Since charging of the unselected word line is performed by the voltage generator 15, the current "Icc" corresponds to the aforementioned "current consumed by the voltage generator 15".

In the period indicated by an arrow on the waveform of sign DV, fluctuation of the current "Icc" occurs at high rate. On the other hand, in the period indicated by an arrow on the waveform of sign D1, the current "Icc" fluctuates at lower rate. This originates in changing the theoretical voltage "VOUT'" as shown in FIG. 9A or FIG. 9B. As apparent from comparison between the waveform indicated by sign E1 and the waveform indicated by sign E1', the present embodiment makes it possible to reduce the peak value of the current ("Icc") consumed by the voltage generator 15.

Figure 11:
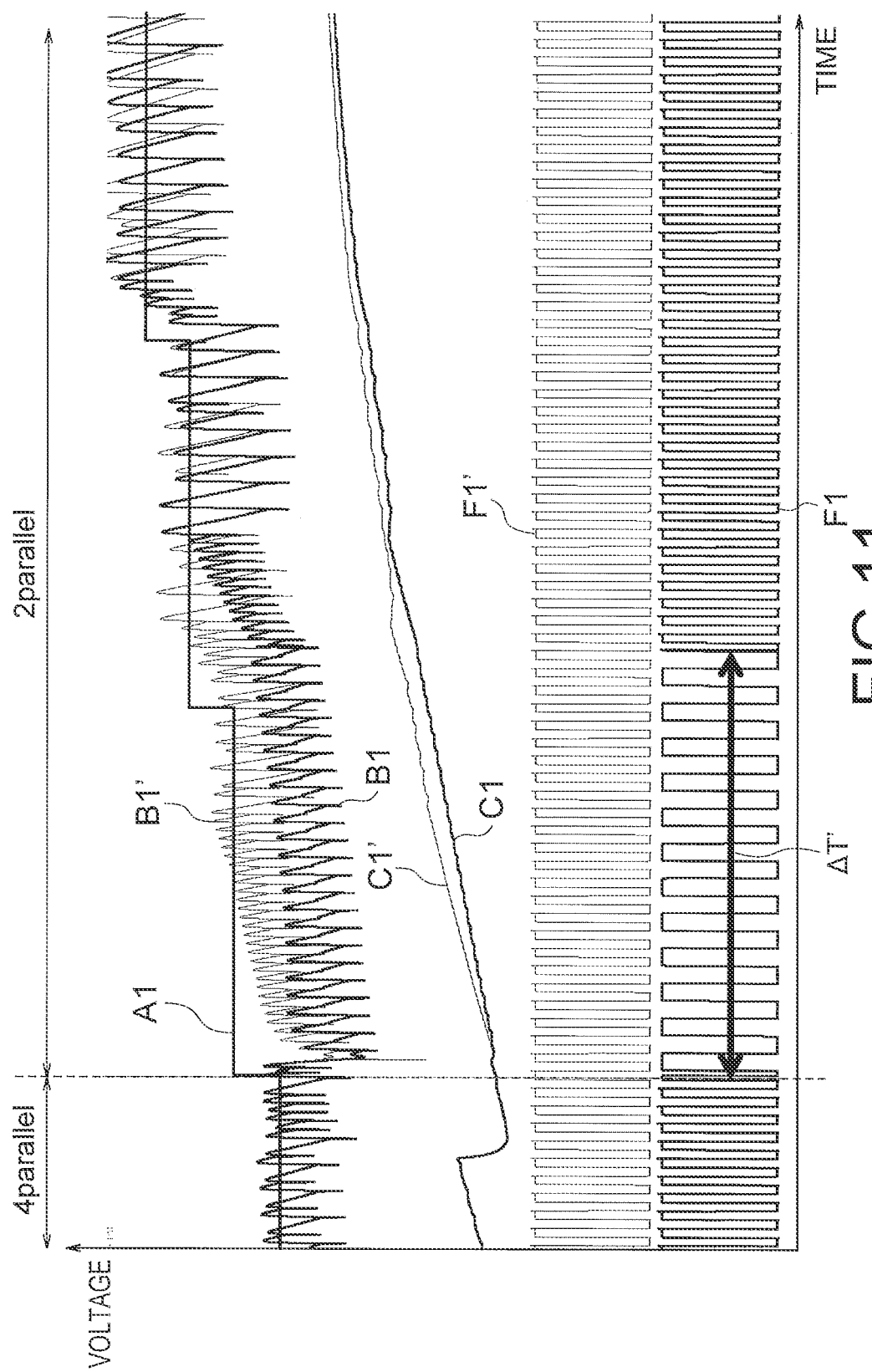
FIG. 11 is a timing chart for further explaining the exemplary operations of the memory system of the second embodiment.

FIG. 11 is a timing chart for further explaining the exemplary operations of the memory system of the second embodiment.

As with FIG. 10, FIG. 11 shows waveforms indicated by signs A1, B1, and C1 regarding an operation in 1st Read of the present embodiment, and shows waveforms indicated by sign B1' and C1' regarding an operation in 1st Read of a comparative example of the present embodiment. FIG. 11 further shows a waveform indicated by sign F1 regarding the operation in 1st Read of the present embodiment. FIG. 11 further shows a waveform indicated by sign F1' corresponding to the waveform indicated by sign F1, regarding the operation in 1st Read of the comparative example of the present embodiment.

In FIG. 11, sign F1 indicates the clock signal CLK used in the voltage generator 15. In a period "ΔT'" indicated by an arrow on the waveform of sign F1, a frequency of the clock signal CLK is decreased to be one half. This makes it possible to reduce the peak value of current consumed by the voltage generator 15 as with the controls shown in FIG. 9A and FIG. 9B. As with the aforementioned period "T", the period "ΔT'" is a period immediately after the state of the voltage generator 15 switches from the four-parallel state to the two-parallel state.

Here, FIG. 9A, FIG. 9B, and FIG. 11 are compared.

In FIG. 9A, the period indicated by sign "ΔT" is the period during which the theoretical voltage "VOUT'" for the unselected word line is not raised. In FIG. 9B, the period indicated by sign "ΔT" is the period during which the voltage rising value of the theoretical voltage "VOUT'" for the unselected word line is decreased. The present embodiment makes it possible to reduce the peak value of current consumed by the voltage generator 15 by changing the theoretical voltage "VOUT'" as shown in FIG. 9A or FIG. 9B. In FIG. 9A and FIG. 9B, the frequency of the clock signal CLK in the period indicated by sign "ΔT" is the same as the frequency in the other periods.

Meanwhile, in FIG. 11, the frequency of the clock signal CLK in the period indicated by sign "ΔT" is one half the frequency in the other periods. The present embodiment makes it possible to reduce the peak value of current consumed by the voltage generator 15 by changing the frequency of the clock signal CLK as shown in FIG. 11. In FIG. 11, the rising rate of the theoretical voltage "VOUT'" in the period indicated by sign "ΔT" is the same as the rising rate of the theoretical voltage "VOUT'" in the other periods. Moreover, in FIG. 11, the rising rate of the theoretical voltage "VOUT'" in the two-parallel state is the same as the rising rate of the theoretical voltage "VOUT'" in the four-parallel state.

As above, in the reading operation, the sequencer 14 of the present embodiment controls the signal BIN for unselected word lines such that the theoretical voltage "VOUT'" for an unselected word line after the state of the voltage generator 15 switches changes in a different manner from that of the theoretical voltage "VOUT'" for the unselected word line before the state of the voltage generator 15 switches. Thereby, the voltage "VOUT" for the unselected word line after the state of the voltage generator 15 switches changes in a different manner from that of the voltage "VOUT" for the unselected word line before the state of the voltage generator 15 switches. Furthermore, the sequencer 14 of the present embodiment causes the theoretical voltage "VOUT'" for the unselected word line at the time point when the state of the voltage generator 15 switches to change in the manner shown in FIG. 9A or FIG. 9B, by controlling the signal BIN for unselected word lines. Therefore, the present embodiment makes it possible to reduce the peak value of current consumed by the voltage generator 15. The same applies to the case where the object of this control is the clock signal CLK in place of the signal BIN as mentioned above.

Third Embodiment

FIGS. 12A to 12C are timing charts for explaining exemplary operations of the memory system of the third embodiment.

Each memory cell of the present embodiment is in any of the case of being an Erase cell and the case of being a Random cell. The Erase cell is a memory cell in which data is not written after data is erased. The Random cell is a memory cell in which data is written. For example, when data is erased from a certain block, and after that, data is written in a certain page in the block, the memory cells in the page are the Random cells. On the other hand, when data is erased from a certain block, and after that, data is not written in any pages in the block, the memory cells in the block are the Erase cells.

FIG. 12A shows waveforms indicated by signs A1' and B1' regarding an operation in 1st Read of a comparative example of the present embodiment. In FIG. 12A, sign A1' indicates the theoretical voltage "VOUT'" for an unselected word line, and sign B1' indicates the voltage "VOUT" for the unselected word line. In FIG. 12A, the unselected cells that are electrically connected to the unselected word line are the Erase cells.

FIG. 12B also shows waveforms indicated by signs A1' and B1' regarding an operation in 1st Read of the comparative example of the present embodiment. In FIG. 12B, sign A1' indicates the theoretical voltage "VOUT'" for an unselected word line, and sign B1' indicates the voltage "VOUT" for the unselected word line. In FIG. 12B, the unselected cells that are electrically connected to the unselected word line are the Random cells.

In this comparative example, the waveform of the theoretical voltage "VOUT'" shown in FIG. 12B is the same as the waveform of the theoretical voltage "VOUT'" shown in FIG. 12A. While the voltage of the unselected word line on the Erase cells often becomes low in the first half of the charging period, the voltage of the unselected word line on the Random cells often becomes low in the latter half of the charging period. The reason is that the Erase cells are readily turned on and the timing when a load is viewed is early, and the Random cells are scarcely turned on and the timing when the load is viewed is late. Therefore, although the waveform of the theoretical voltage "VOUT'" shown in FIG. 12B is the same as the waveform of the theoretical voltage "VOUT'" shown in FIG. 12A, the waveform of the voltage "VOUT" shown in FIG. 12B is different from the waveform of the voltage "VOUT" shown in FIG. 12A. For example, the voltage "VOUT" shown in FIG. 12A is low in the period indicated by the arrow in FIG. 12A, and the voltage "VOUT" shown in FIG. 12B is low in the period indicated by the arrow in FIG. 12B.

FIG. 12C shows three current waveforms I(Ideal), I(Erase), and I(Random) regarding the operations in 1st Read of the comparative example of the present embodiment. These indicate time averages for the current "Icc". Note that the waveform I(Ideal) indicates an ideal current waveform. The waveform I(Erase) indicates a current waveform in the case where the unselected cells include more Erase cells than Random cells. The waveform I(Random) indicates a current waveform in the case where the unselected cells include more Random cells than Erase cells. The waveform I(Erase) shows a high peak in the first half of the charging period, and the waveform I(Random) shows a high peak in the latter half of the charging period.

The waveform like I(Erase) arises also in a verifying reading operation (erasing verification) which is performed in the erasing operation. Moreover, the waveform like I(Random) arises also in a verifying reading operation (writing verification) which is performed in the writing operation. Therefore, the following control regarding the Erase cells can also be applied to the erasing verifying operation, and the following control regarding the Random cells can also be applied to the writing verifying operation. In the writing verification, it is examined whether or not data has been correctly written in the memory cells by reading data from the memory cells. In the erasing verification, it is examined whether or not data has been correctly erased from the memory cells by reading data from the memory cells.

Figure 13A:
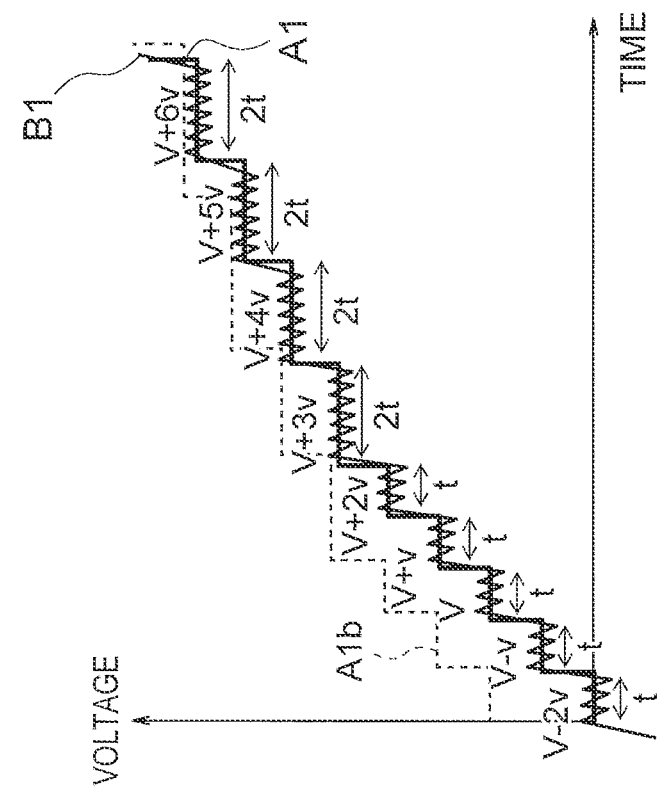
FIGS. 13A and 13B are timing charts for further explaining the exemplary operations of the memory system of the third embodiment.
Figure 13B:
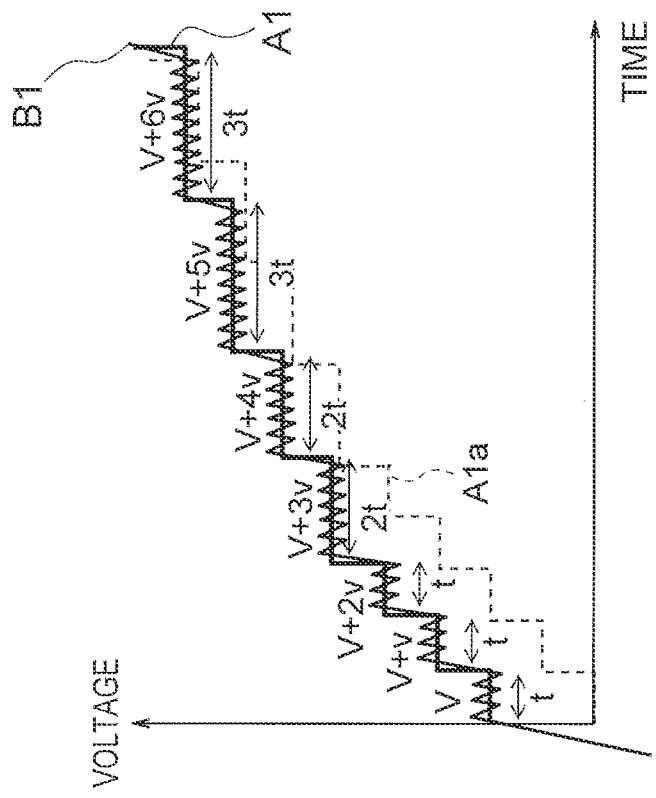

FIGS. 13A and 13B are timing charts for further explaining the exemplary operations of the memory system of the third embodiment.

FIG. 13A shows waveforms indicated by signs A1 and B1 regarding an operation in 1st Read of the present embodiment. In FIG. 13A, sign A1 indicates the theoretical voltage "VOUT'" for an unselected word line, and sign B1 indicates the voltage "VOUT" for the unselected word line. The theoretical voltage "VOUT'" and the voltage "VOUT" shown in FIG. 13A are used in charging the unselected word line on the Erase cells. An operation mode of the sequencer 14 in this stage is an example of a first mode. The theoretical voltage "VOUT'" and the voltage "VOUT" shown in FIG. 13A may be used in charging the unselected word line in the erasing verification for the aforementioned reason.

FIG. 13B also shows waveforms indicated by signs A1 and B1 regarding an operation in 1st Read of the present embodiment. In FIG. 13B, sign A1 indicates the theoretical voltage "VOUT'" for an unselected word line, and sign B1 indicates the voltage "VOUT" for the unselected word line. The theoretical voltage "VOUT'" and the voltage "VOUT" shown in FIG. 13B are used in charging the unselected word line on the Random cells. An operation mode of the sequencer 14 in this stage is an example of a second mode. The theoretical voltage "VOUT'" and the voltage "VOUT" shown in FIG. 13B may be used in charging the unselected word line in the writing verification for the aforementioned reason.

FIG. 13A further shows the waveform A1, with sign "A1b", that is shown in FIG. 13B for comparison with FIG. 13B. Likewise, FIG. 13B further shows the waveform A1, with sign "A1a", that is shown in FIG. 13A for comparison with FIG. 13A.

In the reading operation, the sequencer 14 of the present embodiment controls the signal BIN for unselected cells based on information with which it can be determined whether the unselected cells are the Erase cells or the Random cells. For example, when having acquired information that certain unselected cells are the Erase cells, the sequencer 14 controls the signal BIN such that the waveform of the theoretical voltage "VOUT'" for the unselected cells shapes as in FIG. 13A. On the other hand, when having acquired information that certain unselected cells are the Random cells, the sequencer 14 controls the signal BIN such that the waveform of the theoretical voltage "VOUT'" for the unselected cells shapes as in FIG. 13B. As above, the sequencer 14 of the present embodiment can switch between the former control and the latter control with the signal BIN.

The sequencer 14 of the present embodiment acquires writing information managed by the memory controller 2, as the information with which it can be determined whether the unselected cells are the Erase cells or the Random cell. The writing information is information indicating whether or not writing in each memory cell has been performed. Before starting to charge a certain unselected word line, the sequencer 14 acquires, from the memory controller 2, the writing information regarding the unselected cells on the unselected word line. Based on this writing information, the sequencer 14 controls the waveform of the theoretical voltage "VOUT'" for the unselected word line to be as in FIG. 13A or FIG. 13B. The writing information is an example of performance-or-no-performance-of-writing information. For example, the writing information is sent, along with a reading command, from the memory controller 2 to the NAND memory 1.

As the information with which it can be determined whether the unselected cells are the Erase cells or the Random cells, the sequencer 14 of the present embodiment may acquire information other than the writing information. For example, the sequencer 14 may acquire information regarding a writing pattern written in a plurality of memory cells (pattern information) from the memory controller 2. In this case, the sequencer 14 controls the waveform of the theoretical voltage "VOUT'" to be as in FIG. 13A or FIG. 13B based on the pattern information. This information is also an example of the performance-or-no-performance-of-writing information.

The sequencer 14 of the present embodiment sets the theoretical voltage "VOUT'" at the start of charging for the Random cells to be higher than the theoretical voltage "VOUT'" at the start of charging for the Erase cells. In FIG. 13A and FIG. 13B, the time on the Y-axis is the time of the start of charging. In FIG. 13A and FIG. 13B, the theoretical voltage "VOUT'" at the start of charging for the Erase cells is "V−2v", and the theoretical voltage "VOUT'" at the start of charging for the Random cells is "V" ("V" and "v" are positive real numbers).

The sequencer 14 of the present embodiment further sets timing when the rising cycle of the theoretical voltage "VOUT'" for the Random cells increases from "t" to "2t" to timing earlier than timing when the rising cycle of the theoretical voltage "VOUT'" for the Erase cells increases from "t" to "2t". In FIG. 13A and FIG. 13B, the voltage rising value at one time rising of the theoretical voltage "VOUT'" is always "v". Therefore, timing when the rising rate of the theoretical voltage "VOUT'" for the Random cells decreases from "v/t" to "v/2t" is timing earlier than timing when the rising rate of the theoretical voltage "VOUT'" for the Erase cells decreases from "v/t" to "v/2t". The value "v/t" is an example of a first value, and the value "v/2t" is an example of a second value. The same applies to timing when the rising cycle of the theoretical voltage "VOUT'" increases from "2t" to "3t".

In FIG. 13A, at the time point when time "5t" elapses, that is, at the time point when the theoretical voltage "VOUT'" rises from "V+2v" to "V+3v", the rising cycle of the theoretical voltage "VOUT'" increases from "t" to "2t", and the rising rate of the theoretical voltage "VOUT'" decreases from "v/t" to "v/2t". In FIG. 13B, at the time point when time "3t" elapses, that is, at the time point when the theoretical voltage "VOUT'" rises from "V+2v" to "V+3v", the rising cycle of the theoretical voltage "VOUT'" increases from "t" to "2t", and the rising rate of the theoretical voltage "VOUT'" decreases from "v/t" to "v/2t".

The theoretical voltage "VOUT'" shown in FIG. 13A makes it possible to reduce the current "Icc" in a period near the start of charging by lowering the theoretical voltage "VOUT'" in the period near the start of charging. The reason is that when the theoretical voltage "VOUT'" is lower, the efficiency of the charge pumps CP becomes more excellent and that the load in the period near the start of charging is large for the Erase cells. Moreover, the theoretical voltage "VOUT'" shown in FIG. 13B makes it possible to reduce the rising rate of the theoretical voltage "VOUT'" and to reduce the current "Icc" in a period near the completion of charging, by lowering the theoretical voltage "VOUT'" in the period near the completion of charging. The reason is that when the theoretical voltage "VOUT'" is lower, the efficiency of the charge pumps CP becomes more excellent and that the load in the period near the completion of charging is large for the Random cells. Since when the voltage "VOUT" becomes higher than the theoretical voltage "VOUT'", there arises a period during which the charge pumps CP stop, reducing the rising rate of the theoretical voltage "VOUT'" makes it possible to reduce the average value of the current "Icc". This makes it possible to lower both of the peaks of the waveform I(Erase) and the waveform I(Random) to make the waveform I(Erase) and the waveform I(Random) close to the waveform I(Ideal).

While the waveform of the theoretical voltage "VOUT'" shown in FIG. 13A and the waveform of the theoretical voltage "VOUT'" shown in FIG. 13B differ from each other from a viewpoint of the highness of the charging starting voltage and from a viewpoint of the timing when the rising cycle decreases, they may differ from each other from another viewpoint. For example, these waveforms may differ from each other from a viewpoint of the voltage rising values at the rising of the theoretical voltage "VOUT'". Otherwise, these waveforms may differ from each other in manners as shown in FIG. 14A and FIG. 14B mentioned later.

Figure 14A:
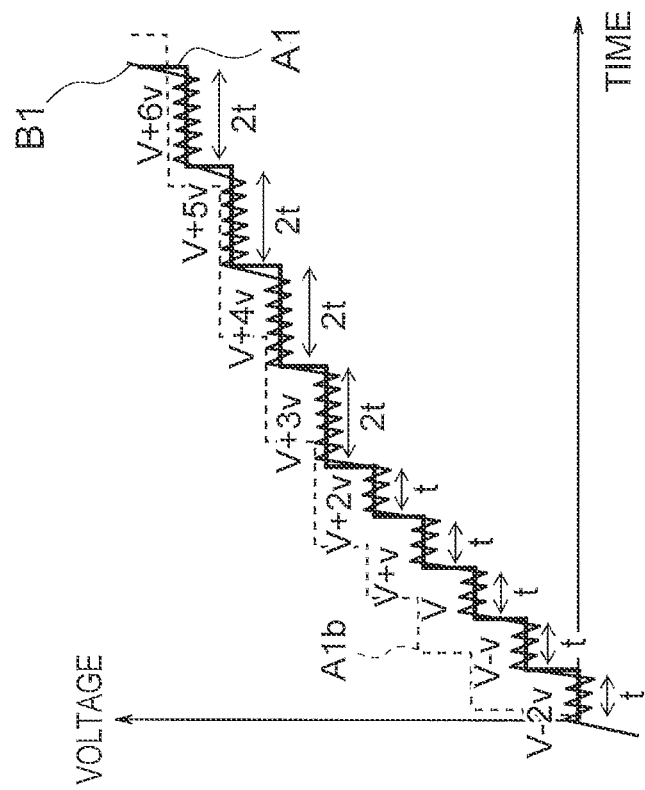
FIGS. 14A and 14B are timing charts for further explaining the exemplary operations of the memory system of the third embodiment.
Figure 14B:
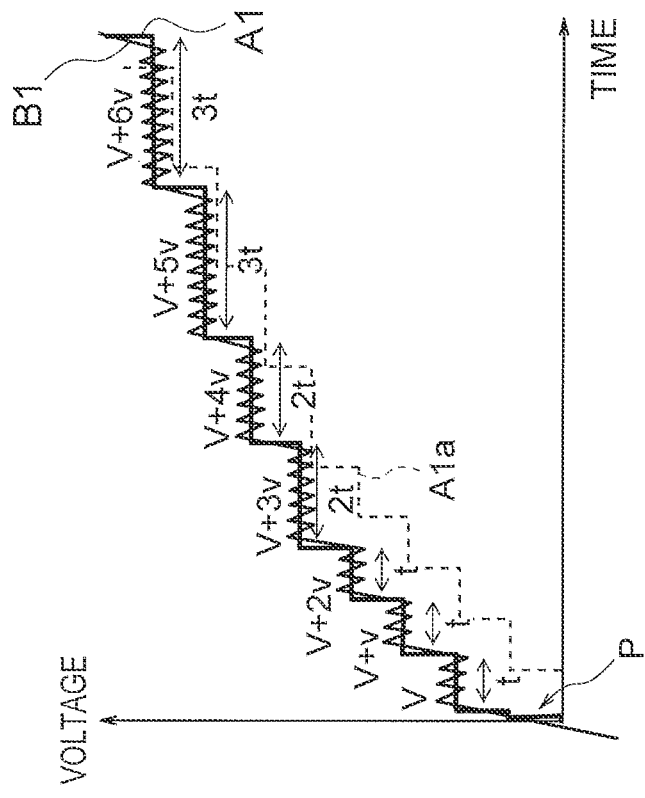

FIGS. 14A and 14B are timing charts for further explaining the exemplary operations of the memory system of the third embodiment.

FIG. 14A shows waveforms indicated by signs A1 and B1 regarding an operation in 1st Read of a modification of the present embodiment. In FIG. 14A, sign A1 indicates the theoretical voltage "VOUT'" for an unselected word line, and sign B1 indicates the voltage "VOUT" for the unselected word line. The theoretical voltage "VOUT'" and the voltage "VOUT" shown in FIG. 14A are used in charging the unselected word line on the Erase cells. An operation mode of the sequencer 14 in this stage is an example of the first mode. The theoretical voltage "VOUT'" and the voltage "VOUT" shown in FIG. 14A may be used in charging the unselected word line in the erasing verification for the aforementioned reason.

FIG. 14B also shows waveforms indicated by signs A1 and B1 regarding an operation in 1st Read of the modification of the present embodiment. In FIG. 14B, sign A1 indicates the theoretical voltage "VOUT'" for an unselected word line, and sign B1 indicates the voltage "VOUT" for the unselected word line. The theoretical voltage "VOUT'" and the voltage "VOUT" shown in FIG. 14B are used in charging the unselected word line on the Random cells. An operation mode of the sequencer 14 in this stage is an example of the second mode. The theoretical voltage "VOUT'" and the voltage "VOUT" shown in FIG. 14B may be used in charging the unselected word line in the writing verification for the aforementioned reason.

FIG. 14A further shows the waveform A1, with sign "A1b", that is shown in FIG. 14B for comparison with FIG. 14B. Likewise, FIG. 14B further shows the waveform A1, with sign "A1a", that is shown in FIG. 14A for comparison with FIG. 14A.

The waveforms indicated by signs A1 and B1 in FIG. 14A are the same as the waveforms indicated by signs A1 and B1 in FIG. 13A. On the other hand, while the waveforms indicated by signs A1 and B1 in FIG. 14B are approximately the same as the waveforms indicated by signs A1 and B1 in FIG. 13B, the waveform indicated by sign A1 in FIG. 14B is different from the waveform indicated by sign A1 in FIG. 13B in a portion indicated by the arrow P.

The sequencer 14 of the present modification sets the rising rate of the theoretical voltage "VOUT'" at the start of charging for the Random cells to be higher than the rising rate of the theoretical voltage "VOUT'" at the start of charging for the Erase cells. Immediately after the start of charging in FIG. 14A, the theoretical voltage "VOUT'" rises from "V−2v" to "V−v" during the time "t", and hence, the rising rate of the theoretical voltage "VOUT'" at the start of charging in FIG. 14A is "v/t". On the other hand, immediately after the start of charging in FIG. 14B, the theoretical voltage "VOUT'" rises from "V−2v" to "V" during a very short time, and hence, the rising rate of the theoretical voltage "VOUT'" at the start of charging in FIG. 14B is higher than "v/t".

The theoretical voltage "VOUT'" shown in FIG. 14A makes it possible to reduce the current "Icc" in a period near the start of charging by lowering the rising rate of the theoretical voltage "VOUT'" in the period near the start of charging and lowering the theoretical voltage "VOUT'" in a period near the completion of charging. The reason is that when the theoretical voltage "VOUT'" is lower, the efficiency of the charge pumps CP becomes more excellent and that the load in the period near the start of charging is large for the Erase cells. Moreover, the theoretical voltage "VOUT'" shown in FIG. 14B makes it possible to reduce the rising rate of the theoretical voltage "VOUT'" and to reduce the current "Icc" in a period near the completion of charging by elevating the rising rate of the theoretical voltage "VOUT'" in a period near the start of charging and lowering the theoretical voltage "VOUT'" in the period near the completion of charging. The reason is that when the theoretical voltage "VOUT'" is lower, the efficiency of the charge pumps CP becomes more excellent and that the load in the period near the completion of charging is large for the Random cells. Since when the voltage "VOUT" becomes higher than the theoretical voltage "VOUT'", there arises a period during which the charge pumps CP stop, reducing the rising rate of the theoretical voltage "VOUT'" makes it possible to reduce the average value of the current "Icc". This makes it possible to lower both of the peaks of the waveform I(Erase) and the waveform I(Random) to make the waveform I(Erase) and the waveform I(Random) close to the waveform I(Ideal).

As above, in the reading operation, the sequencer 14 of the present embodiment controls the signal BIN for unselected cells based on the information indicating whether unselected cells are the Erase cells or the Random cells. Therefore, the present embodiment makes it possible to reduce the peak value of current consumed by the voltage generator 15 when unselected cells are any of the Erase cells and the Random cells.

While for the first to third embodiments, there has been described the control, of the signal BIN, that the sequencer 14 performs in the reading operation, this control in the reading operation can also be applied to verification reading operation (writing verification) that is performed during the writing operation and verification reading operation (erasing verification) that is performed during the erasing operation as mentioned above.

When the control of the third embodiment is applied to the writing verification, many memory cells in a target block in writing data in the first word line of the target block are often the Erase cells. Therefore, the writing verification in this case may be performed by the method shown in FIG. 13A or FIG. 14A. The same applies to writing in word lines that is performed shortly after the writing in the first word line. On the other hand, when data is written in the last word line of the target block, many memory cells in the target block become the Random cells. Therefore, the writing verification in this case may be performed by the method shown in FIG. 13B or FIG. 14B. The same applies to writing in word lines that is performed shortly before the writing in the last word line.

While certain embodiments have been described, these embodiments have been presented by way of example only, and are not intended to limit the scope of the inventions. Indeed, the novel devices described herein may be embodied in a variety of other forms; furthermore, various omissions, substitutions and changes in the form of the devices described herein may be made without departing from the spirit of the inventions. The accompanying claims and their equivalents are intended to cover such forms or modifications as would fall within the scope and spirit of the inventions.

The invention claimed is:

1. A semiconductor storage device comprising:
 a plurality of memory cell transistors;
 a word line electrically connected in common to respective gates of the plurality of memory cell transistors;
 a voltage generator configured to generate a first voltage transferred to the word line, the voltage generator including:
  a charge pump circuit;
  a voltage divider configured to divide the first voltage with a first resistance element and a second resistance element, at least any of the first resistance element and the second resistance element being a variable resistance element that receives a first digital signal indicating a resistance value and is changeable to the resistance value; and a detector including a first input terminal connected to the voltage divider and a second input terminal different from the first input terminal, and configured to detect a monitor voltage supplied to the first input terminal based on a reference voltage supplied to the second input terminal, and control the charge pump circuit; and a control unit configured to output the first digital signal, wherein the control unit outputs the first digital signal such that a theoretical waveform of the first voltage in boosting the first voltage in an erasing verifying operation is different from a theoretical waveform of the first voltage in boosting the first voltage in a reading operation.

2. The device of claim 1, wherein the control unit outputs the first digital signal such that the theoretical waveform of the first voltage in boosting the first voltage in the erasing verifying operation is different from a theoretical waveform of the first voltage in boosting the first voltage in a writing verifying operation.

3. The device of claim 1, wherein the control unit outputs the first digital signal such that a theoretical waveform of the first voltage in boosting the first voltage when there exists writing in at least one of the plurality of memory cell transistors is different from a theoretical waveform of the first voltage in boosting the first voltage when there exists no writing in at least one of the plurality of memory cell transistors.

4. The device of claim 3, wherein the control unit outputs the first digital signal such that a time width during which a theoretical value of the first voltage is kept constant is increased from a first width to a second width in first timing in a first mode, and is increased from the first width to the second width in second timing earlier than the first timing in a second mode.

5. The device of claim 4, wherein the control unit outputs the first digital signal such that a theoretical value of a voltage to start boosting the first voltage is set to a first value in the first mode, and is set to a second value higher than the first value in the second mode.

6. The device of claim 4, wherein the control unit outputs the first digital signal such that a theoretical value of a voltage to start boosting the first voltage in the first mode and a theoretical value of a voltage to start boosting the first voltage in the second mode are set to an identical value.

7. The device of claim 4, wherein the control unit outputs the first digital signal such that the time width during which the theoretical value of the first voltage is kept constant is set to the first value from start of boosting the first voltage in the first mode, and is set to the first value after the start of boosting the first voltage in the second mode.

8. The device of claim 3, wherein the control unit acquires information with which it is able to determine whether or not there exists writing in at least one of the plurality of memory cell transistors, from a controller configured to control the semiconductor storage device.

9. A semiconductor storage device comprising:
a plurality of memory cell transistors;
a word line electrically connected in common to respective gates of the plurality of memory cell transistors;
a voltage generator configured to generate a first voltage transferred to the word line, the voltage generator including:
a charge pump circuit;
a voltage divider configured to divide the first voltage with a first resistance element and a second resistance element, at least any of the first resistance element and the second resistance element being a variable resistance element that receives a first digital signal indicating a resistance value and is changeable to the resistance value; and a detector including a first input terminal connected to the voltage divider and a second input terminal different from the first input terminal, and configured to detect a monitor voltage supplied to the first input terminal based on a reference voltage supplied to the second input terminal, and control the charge pump circuit; and a control unit configured to output the first digital signal, wherein the control unit outputs the first digital signal such that a theoretical waveform of the first voltage in boosting the first voltage in first reading and a theoretical waveform of the first voltage in boosting the first voltage in second reading that is performed after the first reading change in different manners.

10. The device of claim 9, wherein the control unit outputs the first digital signal such that a theoretical value of the first voltage at start of boosting for the second reading is set to be higher than a theoretical value of the first voltage at start of boosting for the first reading.

11. The device of claim 9, wherein the control unit outputs the first digital signal such that a boosting rate of the theoretical value of the first voltage in the second reading is set to be higher than a boosting rate of the theoretical value of the first voltage in the first reading, in a predetermined time from start of boosting.

12. The device of claim 9, wherein the control unit outputs the first digital signal such that a time width during which the theoretical value of the first voltage is kept constant in the second reading is set to be shorter than a time width during which the theoretical value of the first voltage is kept constant in the first reading, in a predetermined time from start of boosting.

13. The device of claim 9, wherein the control unit outputs the first digital signal such that the number of times of boosting the theoretical value of the first voltage in the second reading is set to be more than the number of times of boosting the theoretical value of the first voltage in the first reading, in a predetermined time from start of boosting.

14. A semiconductor storage device comprising:
a plurality of memory cell transistors;
a word line electrically connected in common to respective gates of the plurality of memory cell transistors;
a voltage generator configured to generate a first voltage transferred to the word line, the voltage generator including:
a charge pump circuit;
a voltage divider configured to divide the first voltage with a first resistance element and a second resistance element, at least any of the first resistance element and the second resistance element being a variable resistance element that receives a first digital signal indicating a resistance value and is changeable to the resistance value; and a detector including a first input terminal connected to the voltage divider and a second input terminal different from the first input terminal, and configured to detect a monitor voltage supplied to the first input terminal based on a reference voltage supplied to the second input terminal, and control the charge pump circuit; and a control unit configured to output the first digital signal, wherein the control unit outputs the first digital signal such that a theoretical waveform of the first voltage in boosting the first voltage before a state of the voltage generator switches and a theoretical waveform of the first voltage in boosting the first voltage after the state of the voltage generator switches change in different manners, or a clock signal causing the voltage generator to operate in boosting the first voltage before a state of the voltage generator switches and a clock signal causing the voltage generator to operate in boosting the first voltage after the state of the voltage generator switches change in different manners.

15. The device of claim 14, wherein the control unit outputs the first digital signal such that a time width during which a theoretical value of the first voltage is kept constant after the state of the voltage generator switches is set to be longer than a time width during which the theoretical value of the first voltage is kept constant before the state of the voltage generator switches.

16. The device of claim 14, wherein the control unit outputs the first digital signal such that a time width during which a theoretical value of the first voltage is kept constant at a time point when or immediately after the state of the voltage generator switches is set to be longer than a time width during which the theoretical value of the first voltage is kept constant before and after the state of the voltage generator switches.

17. The device of claim 14, wherein the control unit outputs the first digital signal such that a boosting width of a theoretical value of the first voltage at a time point when or immediately after the state of the voltage generator switches is set to be shorter than a boosting width of the theoretical value of the first voltage before and after the state of the voltage generator switches.

18. The device of claim 14, wherein the control unit outputs the first digital signal such that a frequency of the clock signal at a time point when or immediately after the state of the voltage generator switches is set to be smaller than a frequency of the clock signal of the first voltage before and after the state of the voltage generator switches.

19. The device of claim 14, wherein the charge pump circuit includes a plurality of charge pumps to which a second voltage is input, generates the first voltage with at least one of the plurality of charge pumps, and outputs the first voltage.

20. The device of claim 19, wherein the plurality of charge pumps are electrically connectable to each other through series connection or parallel connection, and the state of the voltage generator is caused to switch such that a connection state of the plurality of charge pumps changes.

* * * * *